US011453956B2

(12) United States Patent
D'Evelyn et al.

(10) Patent No.: US 11,453,956 B2
(45) Date of Patent: Sep. 27, 2022

(54) METHOD FOR GROWTH OF A MERGED CRYSTAL BY BONDING AT LEAST A FIRST AND SECOND CRYSTAL TO AN ADHESION LAYER TO FORM A TILED SUBSTRATE AND GROWING A CRYSTALLINE COMPOSITION OVER SAID TILED SUBSTRATE

(71) Applicant: SLT TECHNOLOGIES, INC., Los Angeles, CA (US)

(72) Inventors: Mark P. D'Evelyn, Santa Barbara, CA (US); James S. Speck, Fremont, CA (US); Derrick S. Kamber, Fremont, CA (US); Douglas W. Pocius, Fremont, CA (US)

(73) Assignee: SLT Technologies, Inc., Los Angeles, CA (US)

( * ) Notice: Subject to any disclaimer, the term of this patent is extended or adjusted under 35 U.S.C. 154(b) by 109 days.

(21) Appl. No.: 16/550,947

(22) Filed: Aug. 26, 2019

(65) Prior Publication Data
US 2020/0087813 A1 Mar. 19, 2020

Related U.S. Application Data

(63) Continuation of application No. 15/426,770, filed on Feb. 7, 2017, now Pat. No. 10,400,352, which is a
(Continued)

(51) Int. Cl.
*C30B 33/06* (2006.01)
*C30B 7/10* (2006.01)
(Continued)

(52) U.S. Cl.
CPC ............ *C30B 7/105* (2013.01); *C30B 19/068* (2013.01); *C30B 19/12* (2013.01); *C30B 25/02* (2013.01);
(Continued)

(58) Field of Classification Search
CPC .. C30B 7/00; C30B 7/005; C30B 7/10; C30B 7/105; C30B 19/00; C30B 19/06;
(Continued)

(56) References Cited

U.S. PATENT DOCUMENTS 3,303,053 A 2/1967 Strong et al.
4,030,966 A 6/1977 Hornig et al.
(Continued)

FOREIGN PATENT DOCUMENTS

CN 101061570 A 10/2007
JP 2005-289797 10/2005
(Continued)

OTHER PUBLICATIONS

Dorsaz et al., 'Selective oxidation of AlInN Layers for current confinement III-nitride devices', Applied Physics Letters, vol. 87, 2005, pp. 072102.
(Continued)

*Primary Examiner* — Kenneth A Bratland, Jr.
(74) *Attorney, Agent, or Firm* — Patterson + Sheridan LLP

(57) ABSTRACT

Techniques for processing materials in supercritical fluids including processing in a capsule disposed within a high-pressure apparatus enclosure are disclosed. The disclosed techniques are useful for growing crystals of GaN, AlN, InN, and their alloys, including InGaN, AlGaN, and AlInGaN for the manufacture of bulk or patterned substrates, which in turn can be used to make optoelectronic devices, lasers, light emitting diodes, solar cells, photoelectrochemical water splitting and hydrogen generation devices, photodetectors, integrated circuits, and transistors.

29 Claims, 22 Drawing Sheets

Related U.S. Application Data continuation of application No. 13/731,453, filed on Dec. 31, 2012, now Pat. No. 9,564,320, which is a continuation-in-part of application No. 13/160,307, filed on Jun. 14, 2011, now abandoned.

(60) Provisional application No. 61/356,489, filed on Jun. 18, 2010, provisional application No. 61/386,879, filed on Sep. 27, 2010.

(51) Int. Cl.
   - H01L 21/02 (2006.01)
   - H01L 29/20 (2006.01)
   - C30B 25/02 (2006.01)
   - C30B 25/18 (2006.01)
   - C30B 29/40 (2006.01)
   - C30B 19/06 (2006.01)
   - C30B 19/12 (2006.01)

(52) U.S. Cl.
   CPC ............ *C30B 25/18* (2013.01); *C30B 29/403* (2013.01); *C30B 29/406* (2013.01); *C30B 33/06* (2013.01); *H01L 21/0254* (2013.01); *H01L 21/02609* (2013.01); *H01L 29/2003* (2013.01)

(58) Field of Classification Search
   CPC ....... C30B 19/068; C30B 19/12; C30B 25/00; C30B 25/02; C30B 25/18; C30B 29/00; C30B 29/10; C30B 29/40; C30B 29/403; C30B 29/406; C30B 33/00; C30B 33/06; H01L 21/0254; H01L 21/02609; H01L 21/2003
   USPC ....... 117/84, 88, 94, 99–101, 106, 109, 937, 117/952; 438/455, 459, 503–504, 766, 438/795, 798
   See application file for complete search history.

(56) References Cited

U.S. PATENT DOCUMENTS

| | | | |
|---|---|---|---|
| 4,066,868 A | 1/1978 | Witkin et al. | |
| 4,350,560 A | 9/1982 | Helgoland et al. | |
| 4,870,045 A | 9/1989 | Gasper et al. | |
| 5,098,673 A | 3/1992 | Engel et al. | |
| 5,127,983 A | 7/1992 | Imai et al. | |
| 5,169,486 A | 12/1992 | Young et al. | |
| 5,474,021 A * | 12/1995 | Tsuno | C30B 25/02 117/101 |
| 6,129,900 A | 10/2000 | Satoh et al. | |
| 6,163,557 A | 12/2000 | Dunnrowicz et al. | |
| 6,273,948 B1 | 8/2001 | Porowski et al. | |
| 6,398,867 B1 | 6/2002 | D'Evelyn et al. | |
| 6,406,540 B1 | 6/2002 | Harris et al. | |
| 6,500,257 B1 | 12/2002 | Wang et al. | |
| 6,528,427 B2 | 3/2003 | Chebi et al. | |
| 6,562,127 B1 * | 5/2003 | Kud | C30B 33/06 117/915 |
| 6,596,079 B1 | 7/2003 | Vaudo et al. | |
| 6,599,362 B2 | 7/2003 | Ashby et al. | |
| 6,656,615 B2 | 12/2003 | Dwilinski et al. | |
| 6,686,608 B1 | 2/2004 | Takahira | |
| 6,756,246 B2 | 6/2004 | Hiramatsu et al. | |
| 6,764,297 B2 | 7/2004 | Godwin et al. | |
| 6,765,240 B2 | 7/2004 | Tischler et al. | |
| 6,784,463 B2 | 8/2004 | Camras et al. | |
| 6,787,814 B2 | 9/2004 | Udagawa | |
| 6,805,745 B2 | 10/2004 | Snyder | |
| 6,806,508 B2 | 10/2004 | D'Evelyn et al. | |
| 6,818,529 B2 * | 11/2004 | Bachrach | G02F 1/136277 438/455 |
| 6,861,130 B2 | 3/2005 | D'Evelyn et al. | |
| 6,887,144 B2 | 5/2005 | D'Evelyn et al. | |
| 7,001,577 B2 | 2/2006 | Zimmerman et al. | |
| 7,026,756 B2 | 4/2006 | Shimizu et al. | |
| 7,053,413 B2 | 5/2006 | D'Evelyn et al. | |
| 7,063,741 B2 | 6/2006 | D'Evelyn et al. | |
| 7,078,731 B2 | 7/2006 | D'Evelyn et al. | |
| 7,098,487 B2 | 8/2006 | D'Evelyn et al. | |
| 7,101,433 B2 | 9/2006 | D'Evelyn et al. | |
| 7,112,829 B2 | 9/2006 | Picard et al. | |
| 7,119,372 B2 | 10/2006 | Stokes et al. | |
| 7,125,453 B2 | 10/2006 | D'Evelyn et al. | |
| 7,160,531 B1 | 1/2007 | Jacques et al. | |
| 7,170,095 B2 | 1/2007 | Vaudo et al. | |
| 7,175,704 B2 | 2/2007 | D'Evelyn et al. | |
| 7,198,671 B2 | 4/2007 | Ueda | |
| 7,220,658 B2 | 5/2007 | Haskell et al. | |
| 7,252,712 B2 | 8/2007 | Dwilinski et al. | |
| 7,279,040 B1 | 10/2007 | Wang | |
| 7,316,746 B2 | 1/2008 | D'Evelyn et al. | |
| 7,335,262 B2 | 2/2008 | Dwilinski et al. | |
| 7,361,576 B2 | 4/2008 | Imer et al. | |
| 7,368,015 B2 | 5/2008 | D'Evelyn et al. | |
| 7,381,391 B2 | 6/2008 | Spencer et al. | |
| 7,420,261 B2 | 9/2008 | Dwili ski et al. | |
| 7,470,938 B2 | 12/2008 | Lee et al. | |
| 7,569,206 B2 | 8/2009 | Spencer et al. | |
| 7,625,446 B2 | 12/2009 | D'Evelyn et al. | |
| 7,642,122 B2 | 1/2010 | Tysoe et al. | |
| 7,704,324 B2 | 4/2010 | D'Evelyn et al. | |
| 7,705,276 B2 | 4/2010 | Giddings et al. | |
| 7,759,710 B1 | 7/2010 | Chiu et al. | |
| 7,932,382 B2 | 4/2011 | Wang et al. | |
| 7,935,382 B2 | 5/2011 | Park et al. | |
| 7,976,630 B2 | 7/2011 | Poblenz et al. | |
| 8,021,481 B2 | 9/2011 | D'Evelyn | |
| 8,039,412 B2 | 10/2011 | Park et al. | |
| 8,048,225 B2 | 11/2011 | Poblenz et al. | |
| 8,097,081 B2 | 1/2012 | D'Evelyn | |
| 8,148,180 B2 | 4/2012 | Felker et al. | |
| 8,148,801 B2 | 4/2012 | D'Evelyn | |
| 8,278,656 B2 | 10/2012 | Mattmann et al. | |
| 8,303,710 B2 | 11/2012 | D'Evelyn | |
| 8,306,081 B1 | 11/2012 | Schmidt et al. | |
| 8,313,964 B2 | 11/2012 | Sharma et al. | |
| 8,323,405 B2 | 12/2012 | D'Evelyn | |
| 8,329,511 B2 | 12/2012 | D'Evelyn | |
| 8,354,679 B1 | 1/2013 | D'Evelyn et al. | |
| 8,430,958 B2 | 4/2013 | D'Evelyn | |
| 8,435,347 B2 | 5/2013 | D'Evelyn et al. | |
| 8,444,765 B2 | 5/2013 | D'Evelyn | |
| 8,461,071 B2 | 6/2013 | D'Evelyn | |
| 8,465,588 B2 | 6/2013 | Poblenz et al. | |
| 8,482,104 B2 | 7/2013 | D'Evelyn et al. | |
| 8,492,185 B1 | 7/2013 | D'Evelyn et al. | |
| 9,012,306 B2 | 4/2015 | Beaumont et al. | |
| 9,209,596 B1 | 12/2015 | McLaurin et al. | |
| 9,589,792 B2 | 3/2017 | Jiang et al. | |
| 9,650,723 B1 | 5/2017 | D'Evelyn et al. | |
| 9,834,859 B2 | 12/2017 | Mori et al. | |
| 10,094,017 B2 | 10/2018 | Pocius et al. | |
| RE47,114 E | 11/2018 | D'Evelyn et al. | |
| 10,400,352 B2 | 9/2019 | D'Evelyn et al. | |
| 10,619,239 B2 | 4/2020 | Pocius et al. | |
| 2001/0011935 A1 | 8/2001 | Lee et al. | |
| 2002/0155691 A1 | 10/2002 | Lee et al. | |
| 2002/0189532 A1 | 12/2002 | Motoki et al. | |
| 2003/0027014 A1 | 2/2003 | Johnson et al. | |
| 2003/0056718 A1 * | 3/2003 | Kawahara | C30B 33/00 117/84 |
| 2003/0082466 A1 * | 5/2003 | del Puerto | H01L 21/681 430/22 |
| 2003/0127041 A1 | 7/2003 | Xu et al. | |
| 2003/0128041 A1 | 7/2003 | Byrd | |
| 2003/0138732 A1 | 7/2003 | Nagase | |
| 2003/0140845 A1 | 7/2003 | D'Evelyn et al. | |
| 2003/0145784 A1 | 8/2003 | Thompson et al. | |
| 2003/0183155 A1 | 10/2003 | D'Evelyn et al. | |
| 2003/0209191 A1 | 11/2003 | Purdy | |
| 2003/0232512 A1 | 12/2003 | Dickinson et al. | |

(56) References Cited

U.S. PATENT DOCUMENTS

| | | |
|---|---|---|
| 2004/0000266 A1 | 1/2004 | D'Evelyn et al. |
| 2004/0007763 A1 | 1/2004 | Cunningham |
| 2004/0023427 A1 | 2/2004 | Chua et al. |
| 2004/0124435 A1 | 7/2004 | D'Evelyn et al. |
| 2004/0245535 A1 | 12/2004 | D'Evelyn et al. |
| 2005/0087753 A1 | 4/2005 | D'Evelyn et al. |
| 2005/0093003 A1 | 5/2005 | Shibata |
| 2005/0098095 A1 | 5/2005 | D'Evelyn et al. |
| 2005/0118349 A1* | 6/2005 | Whitehead ........ H01L 29/66022 427/523 |
| 2005/0128469 A1 | 6/2005 | Hall et al. |
| 2005/0152820 A1 | 7/2005 | D'Evelyn et al. |
| 2005/0170611 A1* | 8/2005 | Ghyselen .......... H01L 21/02032 438/458 |
| 2005/0205215 A1 | 9/2005 | Giddings et al. |
| 2006/0032428 A1 | 2/2006 | Dwilinski et al. |
| 2006/0037529 A1 | 2/2006 | D'Evelyn et al. |
| 2006/0037530 A1 | 2/2006 | Dwilinski et al. |
| 2006/0048699 A1 | 3/2006 | D'Evelyn et al. |
| 2006/0084245 A1 | 4/2006 | Kohda |
| 2006/0096521 A1 | 5/2006 | D'Evelyn et al. |
| 2006/0124051 A1 | 6/2006 | Yoshioka et al. |
| 2006/0177362 A1 | 8/2006 | D'Evelyn et al. |
| 2006/0207497 A1 | 9/2006 | D'Evelyn et al. |
| 2006/0213429 A1 | 9/2006 | Motoki et al. |
| 2006/0228870 A1 | 10/2006 | Oshima |
| 2006/0228901 A1* | 10/2006 | Yoon ................... H01L 21/0254 438/775 |
| 2006/0255341 A1* | 11/2006 | Pinnington ............ B82Y 20/00 257/79 |
| 2006/0288927 A1 | 12/2006 | Chodelka et al. |
| 2007/0012943 A1 | 1/2007 | Okahisa et al. |
| 2007/0057337 A1 | 3/2007 | Kano et al. |
| 2007/0105351 A1 | 5/2007 | Motoki et al. |
| 2007/0131967 A1 | 6/2007 | Kawaguchi et al. |
| 2007/0138505 A1 | 6/2007 | Preble et al. |
| 2007/0141819 A1 | 6/2007 | Park et al. |
| 2007/0142204 A1 | 6/2007 | Park et al. |
| 2007/0151509 A1 | 7/2007 | Park et al. |
| 2007/0158785 A1 | 7/2007 | D'Evelyn et al. |
| 2007/0178039 A1 | 8/2007 | D'Evelyn et al. |
| 2007/0181056 A1 | 8/2007 | D'Evelyn et al. |
| 2007/0197004 A1 | 8/2007 | Dadgar et al. |
| 2007/0210074 A1 | 9/2007 | Maurer et al. |
| 2007/0215033 A1 | 9/2007 | Imaeda et al. |
| 2007/0215887 A1 | 9/2007 | D'Evelyn et al. |
| 2007/0218703 A1 | 9/2007 | Kaeding et al. |
| 2007/0231978 A1 | 10/2007 | Kanamoto et al. |
| 2007/0234946 A1 | 10/2007 | Hashimoto et al. |
| 2007/0252164 A1 | 11/2007 | Zhong et al. |
| 2007/0264733 A1 | 11/2007 | Choi et al. |
| 2007/0274359 A1 | 11/2007 | Takeuchi et al. |
| 2008/0006831 A1 | 1/2008 | Ng |
| 2008/0025360 A1 | 1/2008 | Eichler et al. |
| 2008/0056984 A1 | 3/2008 | Yoshioka et al. |
| 2008/0083741 A1 | 4/2008 | Giddings et al. |
| 2008/0083970 A1 | 4/2008 | Kamber et al. |
| 2008/0087919 A1 | 4/2008 | Tysoe et al. |
| 2008/0096470 A1 | 4/2008 | Hou et al. |
| 2008/0156254 A1* | 7/2008 | Dwilinski ............. C30B 29/406 117/1 |
| 2008/0193363 A1 | 8/2008 | Tsuji |
| 2008/0272462 A1 | 11/2008 | Shimamoto et al. |
| 2009/0092536 A1 | 4/2009 | Kawabata et al. |
| 2009/0140287 A1 | 6/2009 | Fujiwara et al. |
| 2009/0170286 A1* | 7/2009 | Tsukamoto ........ H01L 21/76251 438/458 |
| 2009/0218593 A1 | 9/2009 | Kamikawa et al. |
| 2009/0236694 A1 | 9/2009 | Mizuhara et al. |
| 2009/0250686 A1 | 10/2009 | Sato et al. |
| 2009/0298265 A1 | 12/2009 | Fujiwara |
| 2009/0301387 A1 | 12/2009 | D'Evelyn |
| 2009/0301388 A1 | 12/2009 | D'Evelyn |
| 2009/0309105 A1 | 12/2009 | Letts et al. |
| 2009/0309110 A1 | 12/2009 | Raring et al. |
| 2009/0320744 A1 | 12/2009 | D'Evelyn |
| 2009/0320745 A1 | 12/2009 | D'Evelyn et al. |
| 2010/0001300 A1 | 1/2010 | Raring et al. |
| 2010/0003492 A1 | 1/2010 | D'Evelyn |
| 2010/0003942 A1 | 1/2010 | Ikeda et al. |
| 2010/0025656 A1 | 2/2010 | Raring et al. |
| 2010/0031872 A1 | 2/2010 | D'Evelyn |
| 2010/0031873 A1 | 2/2010 | D'Evelyn |
| 2010/0031874 A1 | 2/2010 | D'Evelyn |
| 2010/0031875 A1 | 2/2010 | D'Evelyn |
| 2010/0031876 A1 | 2/2010 | D'Evelyn |
| 2010/0065854 A1 | 3/2010 | Kamber et al. |
| 2010/0075175 A1 | 3/2010 | Poblenz et al. |
| 2010/0104495 A1 | 4/2010 | Kawabata et al. |
| 2010/0108985 A1 | 5/2010 | Chung et al. |
| 2010/0109126 A1 | 5/2010 | Arena |
| 2010/0147210 A1 | 6/2010 | D'Evelyn |
| 2010/0151194 A1 | 6/2010 | D'Evelyn |
| 2010/0187568 A1 | 7/2010 | Arena |
| 2010/0189981 A1 | 7/2010 | Poblenz et al. |
| 2010/0219505 A1 | 9/2010 | D'Evelyn |
| 2010/0243988 A1 | 9/2010 | Kamikawa et al. |
| 2011/0062415 A1 | 3/2011 | Ohta et al. |
| 2011/0064103 A1 | 3/2011 | Ohta et al. |
| 2011/0068347 A1 | 3/2011 | Strittmatter |
| 2011/0100291 A1 | 5/2011 | D'Evelyn |
| 2011/0101400 A1 | 5/2011 | Chu et al. |
| 2011/0101414 A1 | 5/2011 | Thompson et al. |
| 2011/0124139 A1 | 5/2011 | Chang |
| 2011/0158275 A1 | 6/2011 | Yoshizumi et al. |
| 2011/0175200 A1 | 7/2011 | Yoshida |
| 2011/0183498 A1 | 7/2011 | D'Evelyn |
| 2011/0186860 A1 | 8/2011 | Enya et al. |
| 2011/0220912 A1 | 9/2011 | D'Evelyn |
| 2011/0256693 A1 | 10/2011 | D'Evelyn et al. |
| 2011/0260189 A1 | 10/2011 | Kim |
| 2011/0309373 A1 | 12/2011 | Sharma et al. |
| 2012/0000415 A1 | 1/2012 | D'Evelyn et al. |
| 2012/0091465 A1 | 4/2012 | Krames et al. |
| 2012/0104359 A1 | 5/2012 | Felker et al. |
| 2012/0104412 A1 | 5/2012 | Zhong et al. |
| 2012/0112320 A1 | 5/2012 | Kubo et al. |
| 2012/0118223 A1 | 5/2012 | D'Evelyn |
| 2012/0119218 A1 | 5/2012 | Su |
| 2012/0137966 A1 | 6/2012 | D'Evelyn et al. |
| 2012/0187412 A1 | 7/2012 | D'Evelyn et al. |
| 2013/0112987 A1 | 5/2013 | Fu et al. |
| 2013/0119401 A1 | 5/2013 | D'Evelyn et al. |
| 2013/0126902 A1 | 5/2013 | Isozaki et al. |
| 2013/0251615 A1 | 9/2013 | D'Evelyn et al. |
| 2013/0323490 A1 | 12/2013 | D'Evelyn et al. |
| 2014/0050244 A1 | 2/2014 | Ohno et al. |
| 2014/0065360 A1 | 3/2014 | D'Evelyn et al. |
| 2014/0147650 A1 | 5/2014 | Jiang et al. |
| 2014/0217553 A1 | 8/2014 | Arena et al. |
| 2017/0362739 A1 | 12/2017 | Kajimoto et al. |
| 2018/0087185 A1 | 3/2018 | Yoshida |
| 2018/0202067 A1 | 7/2018 | Hirao et al. |
| 2019/0189439 A1 | 6/2019 | Mikawa et al. |
| 2020/0087813 A1 | 3/2020 | D'Evelyn et al. |
| 2020/0224331 A1 | 7/2020 | D'Evelyn et al. |

FOREIGN PATENT DOCUMENTS

| | | |
|---|---|---|
| JP | 2005-298269 | 10/2005 |
| JP | 2006-315947 | 11/2006 |
| JP | 2007-039321 | 2/2007 |
| JP | 2016037426 A | 3/2016 |
| JP | 2016088756 A | 5/2016 |
| WO | 2004/061923 | 7/2004 |
| WO | 2005/121415 | 12/2005 |
| WO | 2006/038467 A1 | 4/2006 |
| WO | 2006/057463 | 6/2006 |
| WO | 2007/004495 A1 | 1/2007 |
| WO | 2010/068916 A1 | 6/2010 |

(56) References Cited

FOREIGN PATENT DOCUMENTS

| WO | 2011/044554 A1 | 4/2011 |
|---|---|---|
| WO | 2012/016033 | 2/2012 |

OTHER PUBLICATIONS

Grzegory, 'High pressure growth of bulk GaN from Solutions in gallium', Journal of Physics Condensed Matter, vol. 13, 2001, pp. 6875-6892.
Moutanabbir, 'Bulk GaN Ion Cleaving', Journal of Electronic Materials, vol. 39, 2010, pp. 482-488.
Porowski, 'Near Defect Free GaN Substrates', Journal of Nitride Semiconductor, 1999, pp. 1-11.
Sharma et al., 'Vertically oriented GaN-based air-gap distributed Bragg reflector structure fabricated using band-gap-selective photoelectrochemical etching', Applied Physics Letters, vol. 87, 2005, pp. 051107.
Sumiya et al., 'High-pressure synthesis of high-purity diamond crystal', Diamond and Related Materials, 1996, vol. 5, pp. 1359-1365.
Chakraborty et al., 'Defect Reduction in Nonpolar a-Plane GaN Films Using in situ SiNx Nanomask', Applied Physics Letters, vol. 89, 2006, pp. 041903-1-041903-3.
Davidsson et al., 'Effect of AlN Nucleation Layer on the Structural Properties of Bulk GaN Grown on Sapphire by Molecular-Beam Epitaxy', Journal of Applied Physics, vol. 98, No. 1, 2005, pp. 016109-1-016109-3.
Katona et al., 'Observation of Crystallographic Wing Tilt in Cantilever Epitaxy of GaN on Silicon Carbide and Silicon (111) Substrates', Applied Physics Letters, vol. 79, No. 18, 2001, pp. 2907-2909.
Nakamura et al., 'GaN Growth Using GaN Buffer Layer', Japanese Journal of Applied Physics, vol. 30, No. 10A, 1991, pp. L1705-L1707.
Sumiya et al., 'Growth Mode and Surface Morphology of a GaN Film Deposited Along The N-Face Polar Direction on c-Plane Sapphire Substrate', Journal of Applied Physics, vol. 88, No. 2, 2000, pp. 1158-1165.
Callahan et al., 'Synthesis and Growth of Gallium Nitride by The Chemical Vapor Reaction Process (CVRP)', MRS Internet Journal Nitride Semiconductor Research', vol. 4, No. 10, 1999, pp. 1-6.
D'Evelyn et al., 'Bulk GaN Crystal Growth by the High-Pressure Ammonothermal Method', Journal of Crystal Growth, vol. 300, 2007, pp. 11-16.
Dwilinski et al., 'Ammono Method of BN, AlN and GaN Synthesis and Crystal Growth', MRS Internet Journal Nitride Semiconductor Research, vol. 3, No. 25, 1998, pp. 1-5.
Dwilinski et al., 'Excellent Crystallinity of Truly Bulk Ammonothermal GaN', Journal of Crystal Growth, vol. 310, 2008, pp. 3911-3916.
Ehrentraut et al., 'The ammonothermal crystal growth of gallium nitride—A technique on the up rise', Proceedings IEEE, 2010, 98(7), pp. 1316-1323.
Fujito et al., 'Development of Bulk GaN Crystals and Nonpolar/Semipolar Substrates by HVPE', MRS Bulletin, May 2009, vol. 34, No. 5, pp. 313-317.
Fukuda et al., 'Prospects for the Ammonothermal Growth of Large GaN Crystal', Journal of Crystal Growth, vol. 305, 2007, pp. 304-310.
Hashimoto et al., 'A GaN bulk crystal with improved structural quality grown by the ammonothermal method', Nature Materials, vol. 6, 2007, pp. 568-671.
Hashimoto et al., 'Ammonothermal Growth of Bulk GaN', Journal of Crystal Growth, vol. 310, 2008, pp. 3907-3910.
Kolis et al., 'Materials Chemistry and Bulk Crystal Growth of Group III Nitrides in Supercritical Ammonia', Material Resources Society Symposium Proceedings, vol. 495, 1998, pp. 367-372.
Kolis et al., 'Crystal Growth of Gallium Nitride in Supercritical Ammonia', Journal of Crystal Growth, vol. 222, 2001, pp. 431-434.
Motoki et al., 'Growth and Characterization of Freestanding GaN Substrates', Journal of Crystal Growth, vol. 237-239, 2002, pp. 912-921.
Oshima et al., 'Thermal and Optical Properties of Bulk GaN Crystals Fabricated Through Hydride Vapor Phase Epitaxy With Void-Assisted Separation', Journal of Applied Physics, vol. 98, No. 10, Nov. 18, 2005, pp. 103509-1-103509-4.
Schubert etal., Applied Physics Letters, 2007, 91(23), 231114.
Linthicum et al. (Applied Physics Letters, 75, 196, (1999)).
Chen et al. (Applied Physics Letters 75, 2062 (1999)).
Chen et al. (Japanese Journal of Applied Physics 42, L818 (2003)).
Wang et al., Ammonothermal growth of GaN crystals in alkaline solutions, Journal of Crystal Growth 287 (2006) pp. 376-380, 5 pages.
Dorsaz et al., Selective oxidation of AlInN layers for current confinement in III-nitride devices, Applied Physics Letters 87, 072102 (2005), 3 pages.
Pattison et al., Gallium nitride based microcavity light emitting diodes with 2_ effective cavity thickness, Applied Physics Letters 90, 031111 (2007), 3 pages.
Choi et al., 2.5 _ microcavity InGaN light-emitting diodes fabricated by a selective dry-etch thinning process, Applied Physics Letters 91, 061120 (2007), 3 pages.
Altoukhov et al., High reflectivity airgap distributed Bragg reflectors realized by wet etching of AlInN sacrificial layers Applied Physics Letters 95, 1191102 (2009), 3 pages.
Tyagi et al., Partial strain relaxation via misfit dislocation generation at heterointerfaces in (Al,In)GaN epitaxial layers grown on semipolar (1122) GaN free standing substrates, Applied Physics Letters 95, 1191102 (2009), 3 pages.
Porowski et al., High resistivity GaN single crystalline substrates, APPA Vo. 92 (1997), 5 pages.
Tapajna et al. "Influence of threading dislocation density on early degradation in AlGaN/GaN high electron mobility transistors," Applied Physics Letters, 2011, vol. 99, pp. 223501.
Kaun et al., "Effects of Threading Dislocation Density on the Gate Leakage of AlGaN/GaN Heterostructures for High Electron Mobility Transistors," Applied Physics Express, 2011, vol. 4, p. 024101.
Orita et al., "Analysis of Diffusion Involved in Degradation of InGaN-based Laser Diodes," IEEE International Reliability Physics Symposium Proceedings, 2009, pp. 736-740.
International Search Report dated Nov. 2, 2020 for Application No. PCT/US2020/034405).
Gladkov et al., Effect of Fe doping on optical properties of freestanding semi-insulating HVPE GaN:Fe, Journal of Crystal Growth 312 (2010) pp. 1205-1209, 5 pages.
Fang et al., Deep centers in semi-insulating Fe-doped native GaN substrates grown by hydride vapour phase epitaxy, phys. stat. sol. (c) 5, No. 6, pp. 1508-1511 (2008), 4 pages.
Weisbuch et al., Recent results and latest views on microcavity LEDs, Proc. of SPIE, vol. 5366, 2009, pp. 1-19, 19 pages.
Ehrentraut et al.,The Ammonothermal Crystal Growth of Gallium NitrideVA Technique on the Up Rise, Proceedings of the IEEE, vol. 0, No. 0,2009, pp. 1-8, 8 pages.
International Search Report dated May 6, 2021 for Application No. PCT/US2021/017514.
"Semiconductor Wafer Bonding" by Q.-Y. Tong and U. Gosele, Annu. Rev. Mater. Sci., vol. 28, pp. 215-241 (1998).
Cao et al., "Defect generation in InGaN/GaN light-emitting diodes under forward and reverse electrical stresses," Microelectronics Reliability, 2003, vol. 43, pp. 1987-1991.
Tomiya et al., "Dislocation Related Issues in the Degradation of GaN-Based Laser Diodes," IEEE Journal of Selected Topics in Quantum Electronics, 2004, vol. 10, No. 6, pp. 1277-1286.
S. K. Mathis et al., "Modeling of threading dislocation reduction in growing GaN layers," Journal of Crystal Growth, 2001, vol. 231, pp. 371-390.
Darakchieva et al., "Lattice parameters of bulk GaN fabricated by halide vapor phase epitaxy," Journal of Crystal Growth, 2008, vol. 310, pp. 959-965.
Office Action dated Aug. 30, 2021 for U.S. Appl. No. 16/736,274.
Final Office Action dated Nov. 30, 2021 for U.S. Appl. No. 16/736,274.

(56) References Cited

OTHER PUBLICATIONS

Non-Final Office Action for U.S. Appl. No. 16/736,274 dated Apr. 5, 2022.

* cited by examiner

METHOD FOR GROWTH OF A MERGED CRYSTAL BY BONDING AT LEAST A FIRST AND SECOND CRYSTAL TO AN ADHESION LAYER TO FORM A TILED SUBSTRATE AND GROWING A CRYSTALLINE COMPOSITION OVER SAID TILED SUBSTRATE

CROSS REFERENCE TO RELATED APPLICATIONS

This application is a continuation of Ser. No. 15/426,770, filed Feb. 7, 2017, which is a continuation of Ser. No. 13/731,453, filed Dec. 31, 2012, now U.S. Pat. No. 9,564,320, which is continuation-in-part of, and claims priority to U.S. application Ser. No. 13/160,307, filed on Jun. 14, 2011, which claims priority to U.S. Provisional Application No. 61/356,489, filed on Jun. 18, 2010; and to U.S. Provisional Application No. 61/386,879, filed on Sep. 27, 2010; each of which is incorporated herein by reference for all purposes.

BACKGROUND

This disclosure relates to techniques for processing materials in supercritical fluids. Embodiments of the disclosure include techniques for material processing in a capsule disposed within a high-pressure apparatus enclosure. The methods can be applied to growing crystals of GaN, AlN, InN, and their alloys, including, for example, InGaN, AlGaN, and AlInGaN, and others for the manufacture of bulk or patterned substrates. Such bulk or patterned substrates can be used for a variety of applications including optoelectronic devices, lasers, light emitting diodes, solar cells, photoelectrochemical water splitting and hydrogen generation devices, photodetectors, integrated circuits, and transistors, among other devices.

Large area, high quality crystals and substrates, for example, nitride crystals and substrates, are needed for a variety of applications, including light emitting diodes, laser diodes, transistors, and photodetectors. In general, there is an economy of scale with device processing, such that the cost per device is reduced as the diameter of the substrate is increased. In addition, large area seed crystals are needed for bulk nitride crystal growth.

There are known methods for fabrication of large area gallium nitride (GaN) crystals with a (0 0 0 1) c-plane orientation. In many cases, hydride vapor phase epitaxy (HVPE) is used to deposit thick layers of gallium nitride on a non-gallium-nitride substrate such as sapphire, followed by the removal of the substrate. These methods have demonstrated capability for producing free-standing c-plane GaN wafers 50-75 millimeters in diameter, and it is expected that GaN wafers with diameters as large as 100 millimeter can be produced. The typical average dislocation density, however, in these crystals, about $10^6$-$10^8$ cm$^{-2}$, is too high for many applications. Techniques have been developed to gather the dislocations into bundles or low-angle grain boundaries, but it is still very difficult to produce dislocation densities below $10^4$ cm$^{-2}$ in a large area single grain by these methods, and the relatively high concentration of high-dislocation-density bundles or grain boundaries creates difficulties such as performance degradation and/or yield losses for the device manufacturer.

The non-polar planes of gallium nitride, such as $\{1\ 0\ -1\ 0\}$ and $\{1\ 1\ -2\ 0\}$, and the semi-polar planes of gallium nitride, such as $\{1\ 0\ -1\ \pm1\}$, $\{1\ 0\ -1\ \pm2\}$, $\{1\ 0\ -1\ 3\}$, and $\{1\ 1\ -2\ \pm2\}$, $\{2\ 0\ -2\ 1\}$ are attractive for a number of applications. Unfortunately, no large area, high quality non-polar or semi-polar GaN wafers are generally available for large scale commercial applications. Other conventional methods for growing very high quality GaN crystals, for example, with a dislocation density less than $10^4$ cm$^{-2}$ have been proposed. These crystals, however, are typically small, less than 1-5 centimeters in diameter, and are not commercially available.

Legacy techniques have suggested a method for merging elementary GaN seed crystals into a larger compound crystal by a tiling method. Some of the legacy methods use elementary GaN seed crystals grown by hydride vapor phase epitaxy (HVPE) and polishing the edges of the elementary crystals at oblique angles to cause merger in fast-growing directions. Such legacy techniques, however, have limitations. For example, legacy techniques do not specify the accuracy of the crystallographic orientation between the merged elementary seed crystals they provide a method capable of producing highly accurate crystallographic registry between the elementary seed crystals and the observed defects resulting from the merging of the elementary seed crystals.

Conventional techniques are inadequate for at least the reason of failing to meaningfully increase the available size of high-quality nitride crystals while maintaining extremely accurate crystallographic orientation across the crystals.

BRIEF SUMMARY OF THE DISCLOSURE

This disclosure provides a method for growth of a large-area, gallium-containing nitride crystal. The method includes providing at least two nitride crystals having a dislocation density below about $10^7$ cm$^{-2}$ together with a handle substrate. The nitride crystals are bonded to the handle substrate. Then, the nitride crystals are grown to coalescence into a merged nitride crystal. The polar misorientation angle γ between the first nitride crystal and the second nitride crystal is greater than about 0.005 degree and less than about 0.5 degree and the azimuthal misorientation angles α and β are greater than about 0.01 degree and less than about 1 degree. A semiconductor structure can be formed on the nitride crystals as desired.

In another embodiment, the disclosure includes the steps above, and also includes methods of providing a release layer and a high quality epitaxial layer on each of the two nitride crystals. The epitaxial layers are grown to cause coalescence of the two nitride crystals into a merged nitride crystal. The polar misorientation angle γ between the first nitride crystal and the second nitride crystal is less than 0.5 degree and azimuthal misorientation angles α and β are less than 1 degree.

The disclosed methods can provide a crystal that includes at least two single crystal domains having a nitride composition and characterized by a dislocation density within each of the domains of less than $10^7$ cm$^{-2}$. Each of the at least two single crystal domains is separated by a line of dislocations with a linear density greater than 50 cm$^{-1}$ and less than $5\times10^5$ cm$^{-1}$. The polar misorientation angle γ between the first domain and the second domain is less than 0.5 degree and the azimuthal misorientation angles α and β are less than 1 degree.

In a first aspect, crystals comprising at least two single crystal domains having a nitride composition are disclosed comprising: a first domain having a first thickness, a first lateral dimension, and a second lateral dimension, wherein the first lateral dimension and the second lateral dimension define a plane that is perpendicular to the first thickness, and each of the first lateral dimension and the second lateral dimension is greater than about 2 millimeters; and a second domain having a second thickness, a third lateral dimension and a fourth lateral dimension, wherein the third lateral dimension and the fourth later dimension define a plane that is perpendicular to the second thickness, wherein each of the third lateral dimension and the fourth lateral dimension is greater than about 2 millimeters; wherein each of the at least two single crystal domains are characterized by a dislocation density of less than $10^7$ cm$^{-2}$, are separated by a line of dislocations with a linear density between about 50 cm$^{-1}$ and about $5 \times 10^5$ cm$^{-1}$, and a polar misorientation angle γ between the first domain and the second domain is greater than about 0.005 degrees and less than about 0.5 degrees and misorientation angles α and β are greater than about 0.01 degrees and less than about 1 degree.

In a second aspect, method of fabricating a crystal are disclosed, comprising: providing at least two crystals, each of the at least two crystals characterized by a dislocation density below about $10^7$ cm$^{-2}$; providing a handled substrate; bonding the at least two crystals to the handle substrate; and growing the at least two crystals to cause a coalescence into a merged crystal; wherein the merged crystal comprises a first domain and a second domain characterized by a polar misorientation angle γ between the first domain and the second domain is greater than about 0.005 degrees and less than about 0.5 degrees and the misorientation angles α and β between the first domain and the second domain are greater than about 0.01 degrees and less than about 1 degree.

DETAILED DESCRIPTION

Figure 1A:
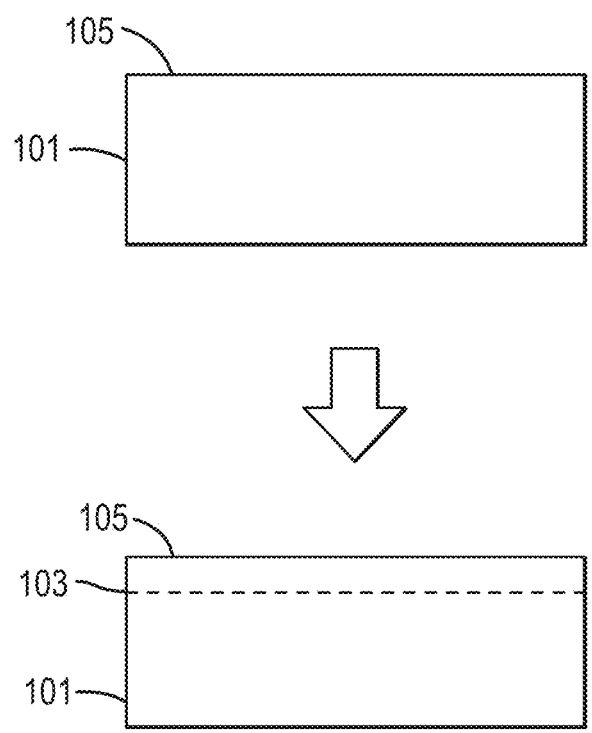
FIGS. 1A, 1B, 1C, 1D, 1E, 1F, 1G, 1H, 1I, 1J, and 1K are diagrams illustrating methods for bonding crystals.

Referring to FIG. 1A, a crystal 101 having a first surface 105 is provided. Herein discussed is a crystal, referred to as crystal 101 as a "nitride crystal", as nitride crystals with a wurtzite crystal structure, which crystal and crystal structure is discussed in detail for a particular set of embodiments. The method disclosed also uses the term "nitride crystal", which includes non-nitride crystals and nitride crystals. Examples of non-nitride crystals include diamond, cubic boron nitride, boron carbide, silicon, silicon carbide, germanium, silicon germanium, indium phosphide, gallium phosphide, zinc oxide, zinc selenide, gallium arsenide, cadmium telluride, and cadmium zinc telluride. In certain embodiments, nitride crystal 101 comprises GaN or $Al_xIn_yGa_{(1-x-y)}N$, where 0≤x and y≤1 and is characterized a very high crystallographic quality. In another embodiment, crystal 101 has a wurtzite crystal structure and is selected from ZnO, ZnS, AgI, CdS, CdSe, 2H—SiC, 4H—SiC, and 6H—SiC. Nitride crystal 101 preferably has a surface dislocation density less than about $10^7$ cm$^{-2}$, $10^6$ cm$^{-2}$, $10^5$ cm$^{-2}$, $10^4$ cm$^{-2}$, $10^3$ cm$^{-2}$, or in certain embodiments, less than about $10^2$ cm$^{-2}$. Nitride crystal 101 also preferably has a stacking-fault concentration below $10^4$, below $10^3$ cm$^{-1}$, $10^2$ cm$^{-1}$, 10 cm$^{-1}$, or in certain embodiments, below 1 cm$^{-1}$. Nitride crystal 101 also has a symmetric x-ray rocking curve full width at half maximum (FWHM) less than about 300 arc sec, 200 arc sec, 100 arc sec, 50 arc sec, 35 arc sec, 25 arc sec, or in certain embodiments less than about 15 arc sec. Nitride crystal 101 has a crystallographic radius of curvature greater than 0.1 meter, 1 meter, 10 meters, 100 meters, or in certain embodiments, greater than 1000 meters, in up to three independent or orthogonal directions.

Nitride crystal 101 may comprise regions characterized by a relatively high concentration of threading dislocations separated by one or more regions characterized by a relatively low concentration of threading dislocations. The concentration of threading dislocations in the relatively high concentration regions may be greater than about $10^6$ cm$^{-2}$, $10^7$ cm$^{-2}$, or in certain embodiments, greater than about $10^8$ cm$^{-2}$. The concentration of threading dislocations in the relatively low concentration regions may be less than about $10^6$ cm$^{-2}$, $10^5$ cm$^{-2}$, or in certain embodiments, less than about $10^4$ cm$^{-2}$. The thickness of nitride crystal 101 may be between about 10 microns and about 100 millimeters, or in certain embodiments, between about 0.1 millimeter and about 10 millimeters. Crystal 101 may have a first lateral dimension and a second lateral dimension, the lateral dimensions defining a plane that is perpendicular to the thickness of the nitride crystal 101, where each of the first lateral dimension and the second lateral dimension may be at least about 0.5 millimeter, 1 millimeter, 2 millimeters, 4 millimeters, 5 millimeters, 10 millimeters, 15 millimeters, 20 millimeters, 25 millimeters, 35 millimeters, 50 millimeters, 75 millimeters, 100 millimeters, 150 millimeters, or in certain embodiments, at least about 200 millimeters. Surface 105 may be characterized by a crystallographic orientation within 5 degrees, within 2 degrees, within 1 degree, within 0.5 degree, within 0.2 degree, within 0.1 degree, within 0.05 degree, within 0.02 degree, or in certain embodiments, within about 0.01 degree of the (0 0 0 1) Ga-polar plane, the (0 0 0 -1) N-polar plane, the {1 0 -1 0} non-polar plane, or the {1 1 -2 0} non-polar a-plane. Surface 105 may be characterized by a (h k i l) semi-polar orientation, where i=-(h+k) and l and at least one of h and k are nonzero.

In certain embodiments, the crystallographic orientation of surface 105 is within 5 degrees, 2 degrees, 1 degree, 0.5 degree, 0.2 degree, 0.1 degree, 0.05 degree, 0.02 degree, or in certain embodiments, within 0.01 degree of any one of the {1 1 -2 ±2} plane, the {6 0 -6 ±1} plane, the {5 0 -5 ±1} plane, the {40 -4 ±1} plane, the {3 0 -3 ±1} plane, the {5 0 -5 ±2} plane, the {7 0 -7 3} plane, the plane, the {2 0 -2 ±1} plane, the {3 0 -3 ±2} plane, the {4 0 -4 ±3} plane, the {5 0 -5 ±4} plane, the {1 0 -1 ±1} plane, the {1 0 -1 ±2} plane, the {1 0 -1 ±3} plane, the {2 1 -3 ±1} plane, or the {3 0 -3 ±4} plane. Nitride crystal 101 may have a minimum lateral dimension of at least two millimeters, but it can be four millimeters, one centimeter, two centimeters, three centimeters, four centimeters, five centimeters, six centimeters, eight centimeters, or in certain embodiments at least ten centimeters. In other embodiments, crystal 101 is characterized by a cubic crystal structure. In some embodiments, crystal 101 has a cubic diamond structure and is selected from diamond, silicon, germanium, and silicon germanium. In other embodiments, crystal 101 is characterized by a cubic zincblende structure and is selected from cubic BN, BP, BAs, AlP, AlAs, AlSb, β-SiC, GaP, GaAs, GaSb, InP, InAs, ZnS, ZnSe, CdS, CdSe, CdTe, CdZeTe, and HgCdTe. In certain embodiments, the crystallographic orientation of surface 105 is within 5 degrees, 2 degrees, 1 degree, 0.5 degree, 0.2 degree, 0.1 degree, 0.05 degree, 0.02 degree, or in certain embodiments within 0.01 degree of one of the {1 1 1} plane, the {1 1 0} plane, the {1 0 0} plane, the {3 1} plane, and the {2 1 1} plane.

In some embodiments, nitride crystal 101 is grown by hydride vapor phase epitaxy (HVPE) according to known methods. In other embodiments, nitride crystal 101 is grown by molecular beam epitaxy (MBE) or metalorganic chemical vapor deposition (MOCVD). Nitride crystal 101 may be grown on a heteroepitaxial substrate such as sapphire, silicon carbide, or gallium arsenide. In some embodiments, nitride crystal 101 is grown by a flux or high temperature solution method. In one specific embodiment, nitride crystal 101 is grown in a solution comprising gallium metal at a temperature between about 1,400 degrees Celsius and about 1,600 degrees Celsius and a nitrogen pressure between about 10 kbar and about 30 kbar. In some embodiments, nitride crystal 101 is grown ammonothermally. In certain embodiments, nitride crystal 101 is characterized by an atomic impurity concentration of hydrogen (H) greater than about $1 \times 10^{16}$ cm$^{-3}$, greater than about $1 \times 10^{17}$ cm$^{-3}$, or greater than about $1 \times 10^{18}$ cm$^{-3}$. In certain embodiments, a ratio of the atomic impurity concentration of H to an atomic impurity concentration of oxygen (O) is between about 1.1 and about 1000, or between about 5 and about 100. In some embodiments, nitride crystal 101 is characterized by an impurity concentration greater than about $10^{15}$ cm$^{-1}$ of at least one of Li, Na, K, Rb, Cs, Mg, Ca, F, and Cl. In some embodiments, nitride crystal 101 is characterized by an impurity concentration greater than about $10^{14}$ cm$^{-1}$ of at least one of Be, Mg, Ca, Sr, Ba, Sc, Y, a rare earth element, Ti, Zr, Hf, V, Nb, Ta, Cr, Mo, and W. In certain embodiments, nitride crystal 101 is characterized by an impurity concentration of O, H, carbon (C), Na, and K between about $1 \times 10^{16}$ cm$^{-3}$ and $1 \times 10^{19}$ cm$^{-3}$, between about $1 \times 10^{16}$ cm$^{-3}$ and $2 \times 10^{19}$ cm$^{-3}$, below $1 \times 10^{17}$ cm$^{-3}$, below $1 \times 10^{16}$ cm$^{-3}$, and below $1 \times 10^{16}$ cm$^{-3}$, respectively, as quantified by calibrated secondary ion mass spectrometry (SIMS). In another embodiment, nitride crystal 101 is characterized by an impurity concentration of O, H, C, and at least one of Na and K between about $1 \times 10^{16}$ cm$^{-3}$ and $1 \times 10^{19}$ cm$^{-3}$, between about $1 \times 10^{16}$ cm$^{-3}$ and $2 \times 10^{19}$ cm$^{-3}$, below $1 \times 10^{17}$ cm$^{-3}$, and between about $3 \times 10^{15}$ cm$^{-3}$ and $1 \times 10^{18}$ cm$^{-3}$, respectively, as quantified by calibrated secondary ion mass spectrometry (SIMS). In still another embodiment, nitride crystal 101 his characterized by an impurity concentration of O, H, C, and at least one of F and Cl between about $1 \times 10^{16}$ cm$^{-3}$ and $1 \times 10^{19}$ cm$^{-3}$, between about $1 \times 10^{16}$ cm$^{-3}$ and $2 \times 10^{19}$ cm$^{-3}$, below $1 \times 10^{17}$ cm$^{-3}$, and between about $1 \times 10^{15}$ cm$^{-3}$ and $1 \times 10^{17}$ cm$^{-3}$, respectively, as quantified by calibrated secondary ion mass spectrometry (SIMS). In some embodiments, nitride crystal 101 is characterized by an impurity concentration of H between about $5 \times 10^{17}$ cm$^{-3}$ and $1 \times 10^{19}$ cm$^{-3}$, as quantified by calibrated secondary ion mass spectrometry (SIMS). In certain embodiments, nitride crystal 101 is characterized by an impurity concentration of copper (Cu), manganese (Mn), and iron (Fe) between about $1 \times 10^{16}$ cm$^{-3}$ and $1 \times 10^{19}$ cm$^{-3}$.

Figure 8:
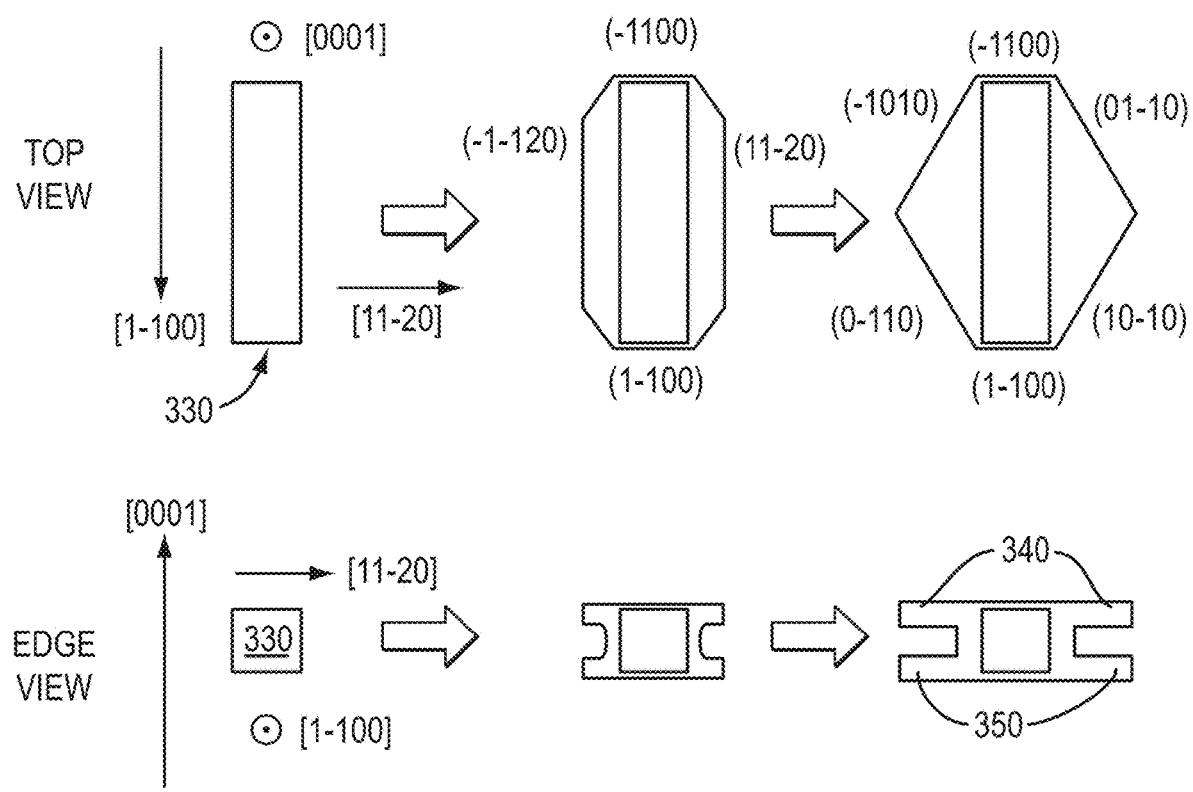
FIGS. 8, 9, and 10 are diagrams illustrating lateral growth from a seed crystal.
Figure 9:
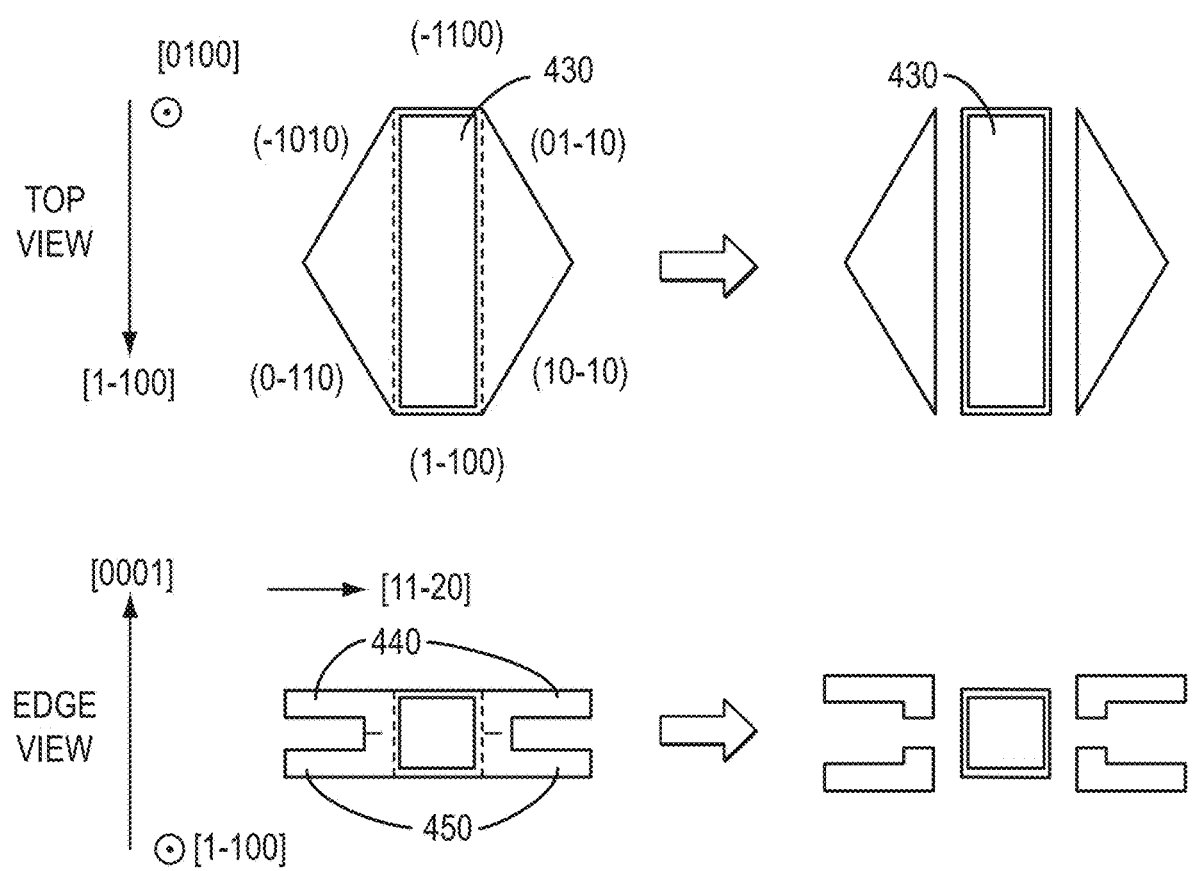
Figure 10:
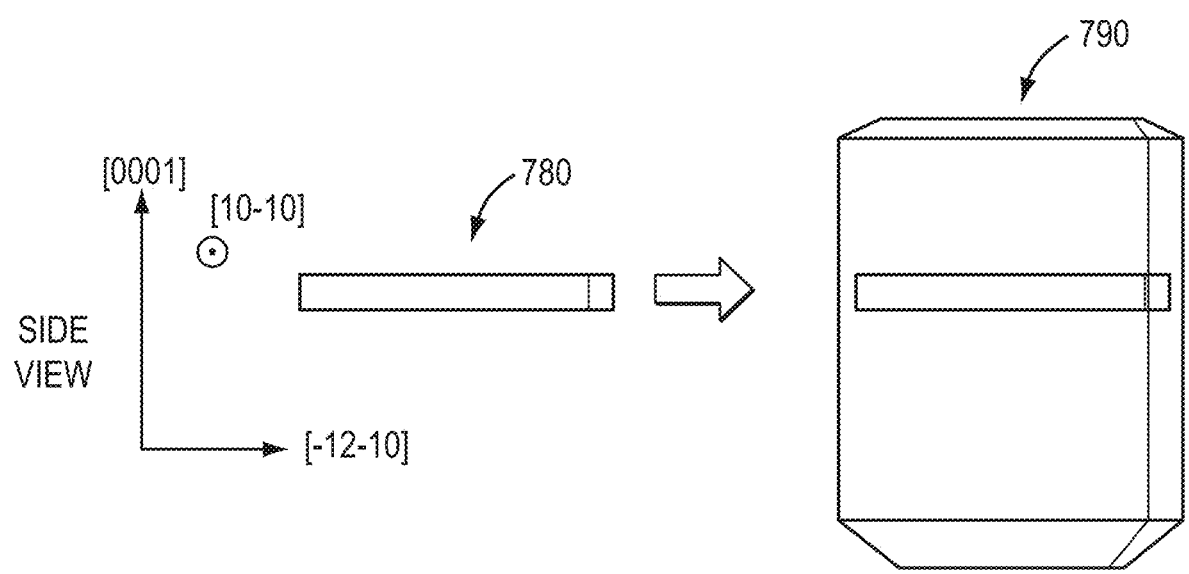

One of the steps in the preparation of nitride crystal 101 can be lateral growth from a seed crystal. Referring to FIG. 8, in certain embodiments a bar-shaped c-plane seed crystal 330 having two a-plane-oriented edges is provided. Ammonothermal growth may be performed, using conditions that favor rapid growth in the a-direction, to produce laterally-grown wings (e.g., wing 340 and wing 350). As shown in FIG. 9, the laterally-grown wings 440 and 450 may be separated from the seed crystal, producing crystals 430 with a shape approximating a half-rhombus. Referring to FIG. 10, in certain embodiments a bar-shaped m-plane seed crystal 780 having +c and −c-plane-oriented edges is provided. Ammonothermal growth may be performed, using conditions that favor rapid growth in the +c- and/or −c-directions, producing laterally-grown crystal 790. If desired, the laterally-grown wings may be separated.

In certain embodiments, nitride crystal 101 may be substantially free of stacking faults. The concentrations of threading dislocations and stacking faults can be quantified on polar (±c-plane) and nonpolar (e.g., m-plane) and a range of semipolar planes, on both HVPE GaN and ammonothermal GaN, by etching in a molten salt comprising one or more of NaOH and KOH, or in a solution comprising one or more of $H_3PO_4$ and $H_3PO_4$ that has been conditioned by prolonged heat treatment to form polyphosphoric acid, and $H_2SO_4$, at temperatures between about 100 degrees Celsius and about 500 degrees Celsius for times between about 5 minutes and about 5 hours; where the processing temperature and time are selected so as to cause formation of etch pits with diameters between about 1 micrometer and about 25 micrometers. Large area nonpolar and semipolar nitride crystals that are substantially free of stacking faults, that is, where the stacking fault concentration is below about $10^3$ cm$^{-1}$, below about $10^2$ cm$^{-1}$, below about 10 cm$^{-1}$, or below about 1 cm$^{-1}$, may be prepared by extended ammonothermal lateral growth from a seed crystal to form a wing or sector followed by separation of the laterally-grown wing or sector from the seed and removal of residual defective material from the laterally-grown wing or sector.

Referring again to FIG. 1A, in some embodiments, the conditions for the final growth step of crystal 101 are chosen so that the crystal grows to the nominal orientation and is highly flat. For example, the growth condition may be chosen so that the growth rates in directions parallel to surface 105 are greater, by at least a factor of 2, a factor of 5, a factor of 10, a factor of 20, or a factor of 50, than the growth rate perpendicular to surface 105. Establishing an on-axis orientation by direct growth may be particularly advantageous when surface 105 has an orientation selected from the (0 0 0 1) Ga-polar plane, the (0 0 0 −1) N-polar plane, the {1 0 −1 0} non-polar plane, and the {1 0 −1 ±1} semi-polar plane. Additional steps in the preparation of nitride crystal 101 and of surface 105 may include grinding, dicing, sawing, lapping, polishing, dry etching, and chemical mechanical polishing. Surface 105 may be optically flat, with a deviation from flatness less than 1 micron, 0.5 micron, 0.2 micron, 0.1 micron, or in certain embodiments less than 0.05 micron. Surface 105 may be smooth, with a root-mean-square roughness less than 5 nanometers, 2 nanometers, 1 nanometer, 0.5 nanometers, 0.2 nanometer, 0.1 nanometer, or in certain embodiments less than 0.05 nanometer, measured over an area of at least 10 microns×10 microns.

In some embodiments, at least one edge, at least two edges, or at least three edges of nitride crystal 101 are as-grown. In some embodiments, at least one edge, at least two edges, or at least three edges of nitride crystal 101 are cleaved. In some embodiments, at least one edge, at least two edges, or at least three edges of nitride crystal 101 are diced, sawed, ground, lapped, polished, and/or etched, for example, by reactive ion etching (RIE) or inductively-coupled plasma (ICP). In one specific embodiment, one or more edges of the surface of crystal 101 are defined by etching one or more trenches in a larger crystal. In some embodiments, at least one edge, at least two edges, or at least three edges of nitride crystal 101 have a {1 0 −1 0} m-plane orientation. In one specific embodiment, nitride crystal 101 has a substantially hexagonal shape. In another specific embodiment, nitride crystal 101 has a substantially rhombus or half-rhombus shape. In still other embodiments, nitride crystal 101 is substantially rectangular. In one specific embodiment, nitride crystal 101 has a (0 0 0 1)+c-plane edge and a (0 0 0 −1)-c-plane edge. In another specific embodiment, nitride crystal 101 has two {1 1 −2 0} edges. In yet another specific embodiment, nitride crystal 101 has two {1 0 −1 0} edges. In still another specific embodiment, crystal 101 has a cubic crystal structure and at least one edge, at least two edges, or at least three edges have a {111} orientation. In yet another, specific embodiment, crystal 101 has a cubic zincblende crystal structure and at least one edge, at least two edges, or at least three edges have a {110} orientation.

Referring to FIG. 1A, in one set of embodiments, surface 105 of nitride crystal 101 is implanted with ions, forming an implanted/damaged region 103 according to methods that are known in the art. The ion implantation may be performed with at least one of $H^+$, $H_2^+$, $He^+$, $Ne^+$, $Ar^+$, $Kr^+$, $Xe^+$, $N^+$, and $N_2^+$. The implantation energy can be between about 10 keV and about 1 MeV, or in certain embodiments, between about 20 keV and about 200 keV. The ion fluence or dose may be between about $10^{16}$ $cm^{-2}$ and about $10^{19}$ $cm^{-2}$, between about $10^{17}$ $cm^{-2}$ and about $10^{18}$ $cm^{-2}$, or between about $2 \times 10^{17}$ $cm^{-2}$ and about $4 \times 10^{17}$ $cm^{-2}$. In some embodiments, the back side of crystal 101 is also implanted with ions, forming a second implanted/damaged region (not shown), with a similar ion composition, energy, and fluence, so as to minimize bow in crystal 101.

Figure 1B:
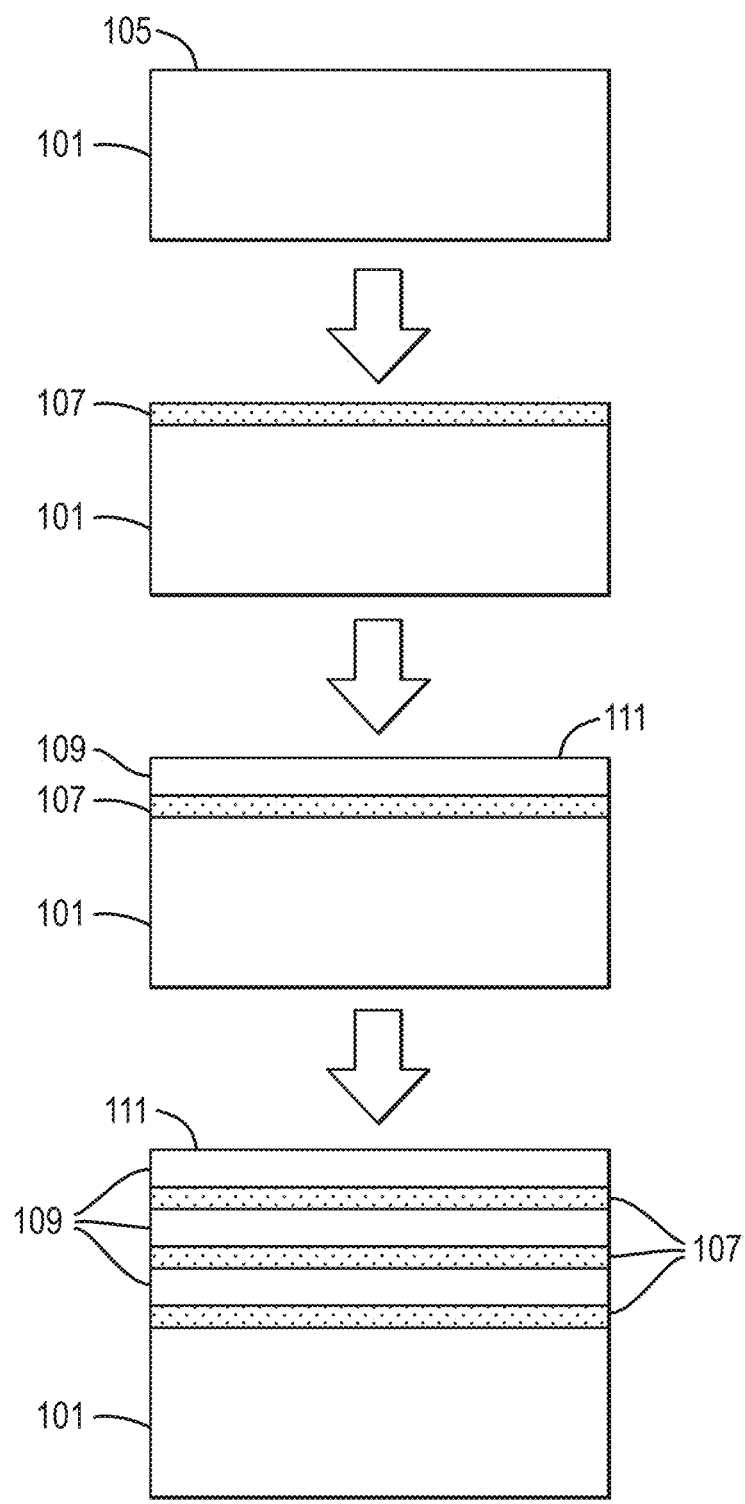

Referring to FIG. 1B, in some embodiments a release layer 107 is provided. In some embodiments, release layer 107 is characterized by an optical absorption coefficient greater than 1,000 $cm^{-1}$ at least one wavelength where nitride crystal 101 having surface 105 is substantially transparent, for example, where nitride crystal 101 is characterized by an optical absorption coefficient less than 50 $cm^{-1}$. In some embodiments, the release layer is characterized by an optical absorption coefficient greater than 5,000 $cm^{-1}$ at least one wavelength where nitride crystal 101 is substantially transparent. In some embodiments, release layer 107 can be selectively wet etched, electrochemically etched, or photoelectrochemically etched preferentially with respect to crystal 101 and with respect to high quality epitaxial layer 109 overlying release layer 107. In some embodiments, the release layer comprises $Al_xIn_yGa_{1-x-y}N$, where $0 \leq x$, y, $x+y \leq 1$. In some embodiments the release layer further comprises at least one impurity to render the release layer strongly absorbing at some wavelengths. A number of dopant impurities, including H, O, C, Mn, Fe, and Co, may render an $Al_xIn_yGa_{1-x-y}N$ or GaN crystal absorbing at visible wavelengths. Heavy doping with cobalt, in particular, can render GaN black, that is, with a high optical absorption coefficient across the visible spectrum. In particular, the optical absorption coefficient may be greater than 5,000 $cm^{-1}$ across the entire visible spectrum, including the range between about 465 nm and about 700 nm. The optical absorption coefficient may also be greater than 5,000 $cm^{-1}$ between about 700 nm and about 3,077 nm and at wavelengths between about 3,333 nm and about 6,667 nm. Incorporation of In can decrease the bandgap of GaN, leading to strong absorption at wavelengths where GaN or AlGaN is substantially transparent. However, the InGaN has inferior temperature stability and a larger lattice mismatch with respect to GaN or AlGaN than does heavily-doped GaN or AlGaN. Release layer 107 may be deposited epitaxially on nitride crystal 101 by metalorganic chemical vapor deposition (MOCVD), hydride vapor phase epitaxy (HVPE), molecular beam epitaxy (MBE), ammonothermal growth, or flux growth, as described in U.S. Pat. No. 8,148,801, which is incorporated by reference in its entirety.

In certain embodiments, the release layer 107 comprises nitrogen and at least one element selected from Si, Sc, Ti, V, Cr, Y, Zr, Nb, Mo, a rare earth element, Hf, Ta, and W. A metal layer may be deposited on the base crystal, to a thickness between about 1 nm and about 1 micron by sputtering, thermal evaporation, e-beam evaporation, or the like. The metal layer may then be nitrided by heating in a nitrogen-containing atmosphere such as ammonia at a temperature between about 600 degrees Celsius and about 1,200 degrees Celsius. During the nitridation process the metal partially de-wets from the base crystal, creating nano-to-micro openings through which high quality epitaxy can take place. The nitridation step may be performed in an MOCVD reactor, in an HVPE reactor, or in an ammonothermal reactor immediately prior to deposition of a high quality epitaxial layer.

In certain embodiments, the release layer 107 comprises $Al_xIn_yGa_{1-x-y}N$, where $0 \leq x$, y, $x+y \leq 1$, but may not have an optical absorption coefficient larger than that of nitride crystal 101. In a particular embodiment, nitride crystal 101 comprises GaN and release layer 107 comprises $Al_{1-x}In_xN$, where x is approximately equal to 0.17 so that the release layer is lattice-matched to nitride crystal 101, also known as the nitride base crystal.

Referring to FIG. 1B, a high quality epitaxial layer 109 may be provided overlying release layer 107. In some embodiments, the high quality epitaxial layer 109 is grown in a separate step, by MOCVD, by MBE, or by HVPE, after deposition of the release layer. In another embodiment, the high quality epitaxial layer is grown ammonothermally. The high quality epitaxial layer 109 may have a thickness between about 0.05 micron and about 500 microns. In some embodiments, the thickness of the high quality epitaxial layer is between about one micron and about 50 microns.

The high quality epitaxial layer 109 has the same crystallographic orientation as nitride crystal 101, to within about 0.5 degree, within 0.2 degree, within 0.1 degree, within 0.05 degree, within 0.02 degree, or within 0.01 degree, and very similar crystallographic properties. High quality epitaxial layer 109 may be between 0.1 micron and 50 microns thick, comprises nitrogen and may have a surface dislocation density below $10^7$ $cm^{-2}$. In particular embodiments, high quality epitaxial layer 109 comprises GaN or $Al_xIn_yGa_{(1-x-y)}N$, where $0 \leq x$, $y \leq 1$ and is characterized by high crystallographic quality. High quality epitaxial layer 109 may be characterized by a surface dislocation density less than about $10^7$ $cm^{-2}$, less than about $10^6$ $cm^{-2}$, less than about $10^5$ $cm^{-2}$, less than about $10^4$ $cm^{-2}$, less than about $10^3$ $cm^{-2}$, or less than about $10^2$ $cm^{-2}$. High quality epitaxial layer 109 may be characterized by a stacking-fault concentration below $10^3$ $cm^{-1}$, below $10^2$ $cm^{-1}$, below 10 $cm^{-1}$ or below 1 $cm^{-1}$. High quality epitaxial layer 109 may be characterized by a symmetric x-ray rocking curve full width at half maximum (FWHM) less than about 300 arc sec, less than about 200 arc sec, less than about 100 arc sec, less than about 50 arc sec, less than about 35 arc sec, less than about 25 arc sec, or less than about 15 arc sec. In some embodiments, the high quality epitaxial layer is substantially transparent, with an optical absorption coefficient below 100 cm$^{-1}$, below 50 cm$^{-1}$, below 5 cm$^{-1}$, or below 1 cm$^{-1}$ at wavelengths between about 700 nm and about 3,077 nm and at wavelengths between about 3,333 nm and about 6,667 nm. In some embodiments, the high quality epitaxial layer is substantially free of low angle grain boundaries, or tilt boundaries. In other embodiments, the high quality epitaxial layer comprises at least two tilt boundaries, with the separation between adjacent tilt boundaries not less than 3 mm. The high quality epitaxial layer may have impurity concentrations of O, H, C, Na, and K below 1×10$^{17}$ cm$^{-3}$, 2×10$^{17}$ cm$^{-3}$, 1×10$^{17}$ cm$^{-3}$, 1×10$^{16}$ cm$^{-3}$, and 1×10$^{16}$ cm$^{-3}$, respectively, as quantified by calibrated secondary ion mass spectrometry (SIMS), glow discharge mass spectrometry (GDMS), interstitial gas analysis (IGA), or the like.

Referring again to FIG. 1B, the process of depositing a release layer 107 and a high quality epitaxial layer 109 may be repeated at least one, at least two, at least four, at least eight, or at least sixteen times. In certain embodiments the high quality epitaxial layers comprise GaN and the release layers comprise lattice-matched Al$_{0.83}$In$_{0.17}$N. In certain embodiments the roles are reversed, and the release layers comprise GaN and the high quality epitaxial layers comprise lattice-matched Al$_{0.83}$In$_{0.17}$N. The outermost surface 111 of the one or more high quality epitaxial layers has the same crystallographic orientation as surface 105.

Figure 1C:
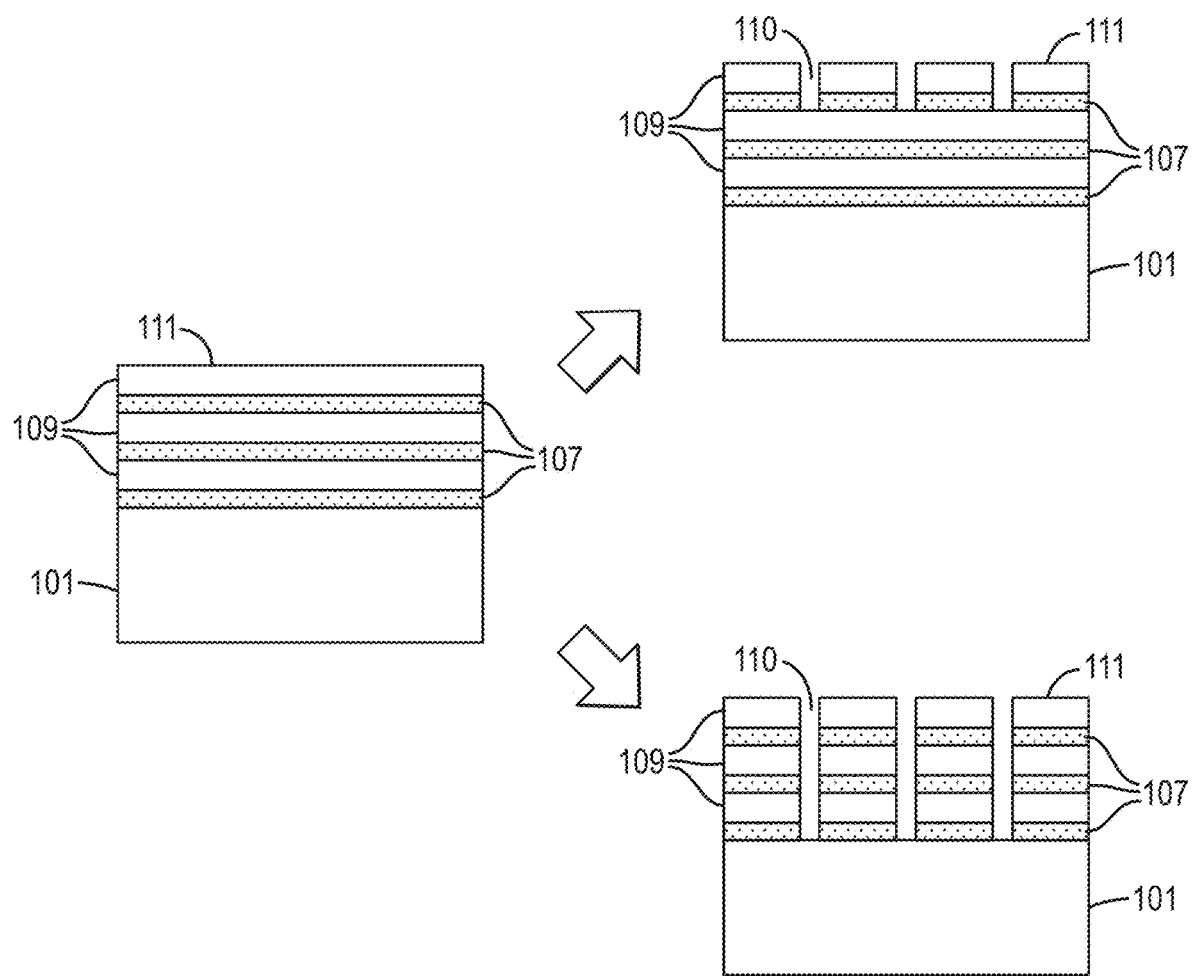

Referring to FIG. 1C, in some embodiments a series of channels 110 are provided through surface 111 of a high quality epitaxial layer 109 and a release layer 107 overlying nitride crystal 101. A pattern, for example, a series of stripes, may be defined by conventional photolithography. Channels 110 may be etched by reactive ion etching (RIE), inductively-coupled plasma (ICP) etching, ion bombardment, or the like. In some embodiments the channels 110 are etched through only a single high quality epitaxial layer. A channel may or may not cut through the outermost release layer, but a release layer is exposed in each channel. In other embodiments the channels are cut through two or more high quality epitaxial layers. The spacing between adjacent channels may be, for example, between about 10 microns and about 10 millimeters, or between about 0.1 millimeter and 1 millimeter.

Figure 1D:
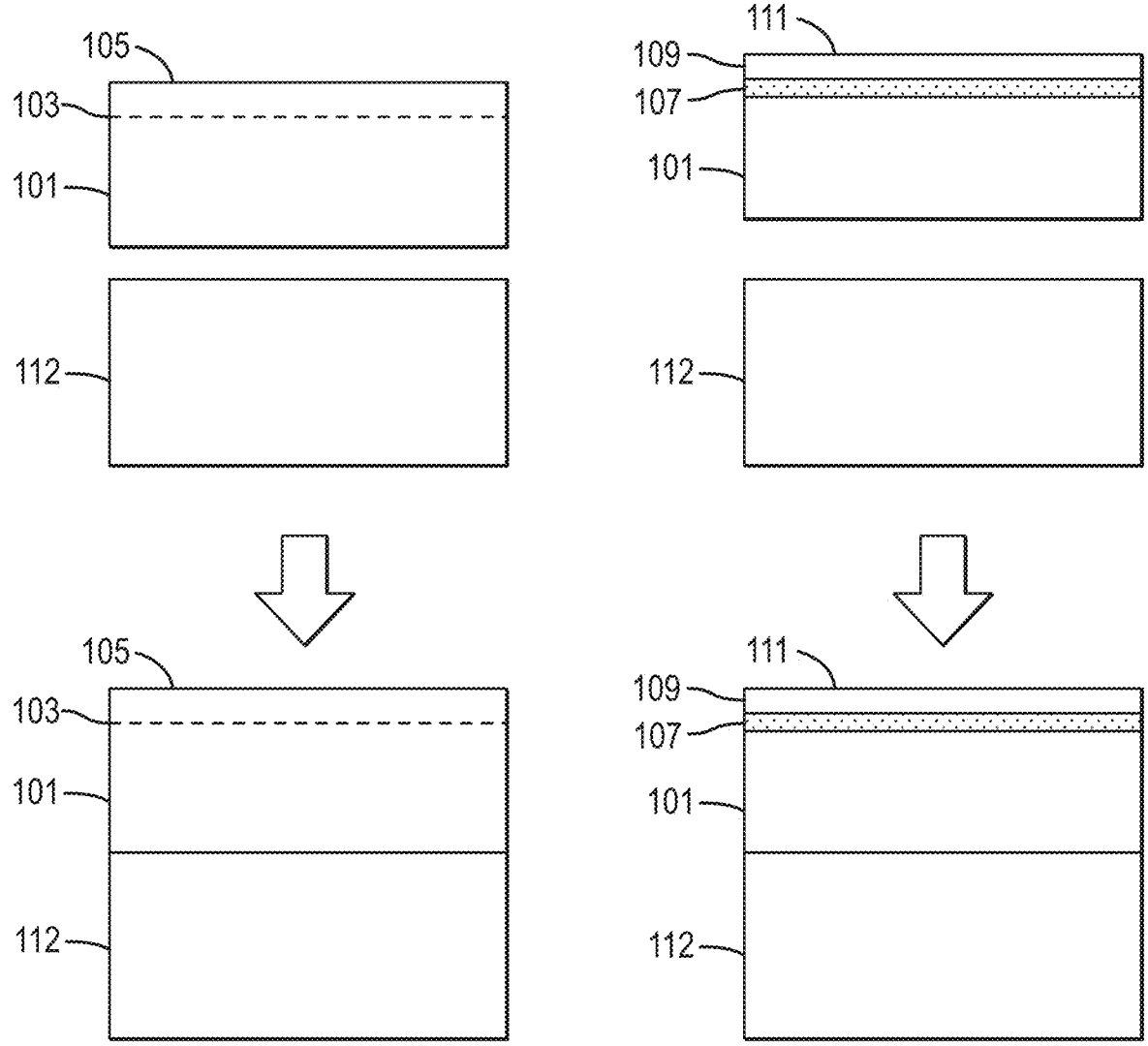

Referring to FIG. 1D, in some embodiments, nitride crystal 101 is affixed to block 112. Block 112 may comprise stainless steel, steel, an iron-based alloy, a nickel-based alloy, a cobalt-based alloy, a copper-based alloy, or the like. Block 112 may have edges that are machined or accurately ground. For example, at least two parallel faces on block 112 may be parallel to within 1 degree, within 0.5 degree, within 0.2 degree, within 0.1 degree, within 0.05 degree, within 0.02 degree, or to within 0.01 degree. At least two perpendicular faces on block 112 may be perpendicular to within 1 degree, within 0.5 degree, within 0.2 degree, within 0.1 degree, within 0.05 degree, within 0.02 degree, or to within 0.01 degree. Nitride crystal 101 may be affixed to block 112 by means of a cement, an epoxy, an adhesive, an Au—Sn eutectic, a solder bond, a braze joint, a polymer-based cement, or the like. One or more edges of nitride crystal 101 may also be accurately ground. At least one edge of nitride crystal 101 may be co-planar with an edge of block 112. In some embodiments, at least two edges of crystal 101 are co-planar with edges of block 112. In certain embodiments, nitride crystal 101 with implanted/damaged region 103 and overlying crystal surface 105 are affixed to block 112. In certain embodiments, nitride crystal 101, having release layer 107 and overlying high quality epitaxial layer 109 with crystal surface 111 are affixed to block 112.

Figure 1E:
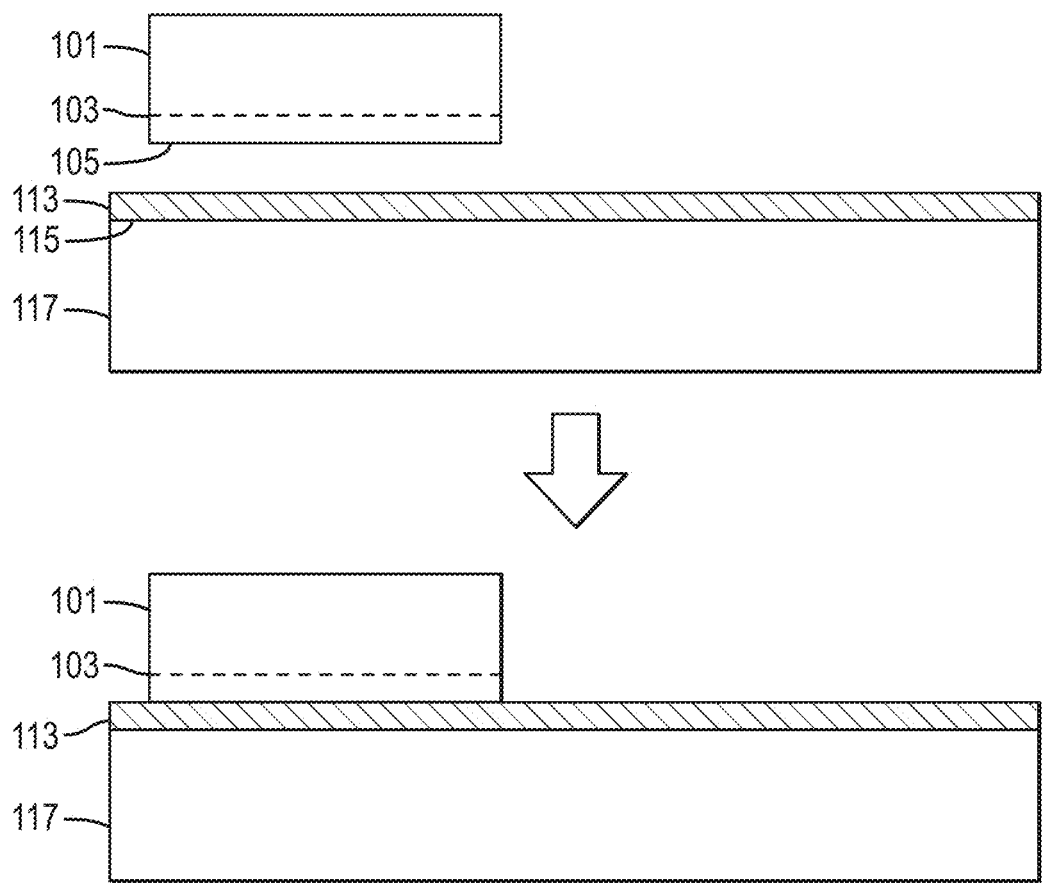
Figure 1F:
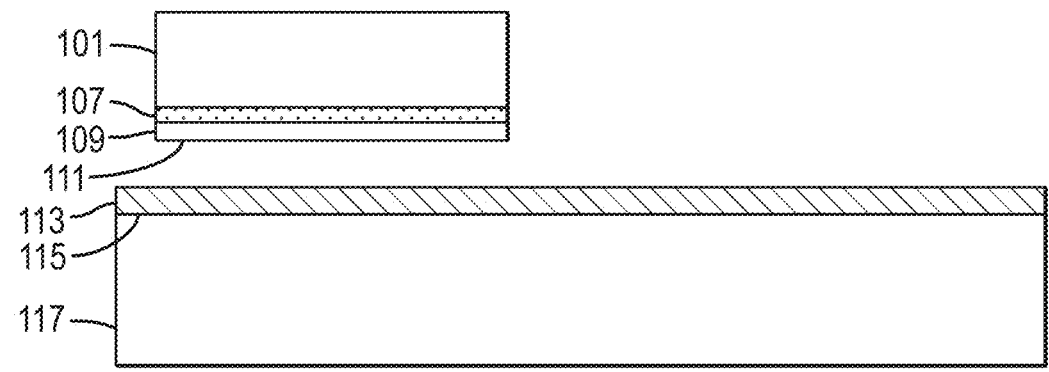
Figure 1F:
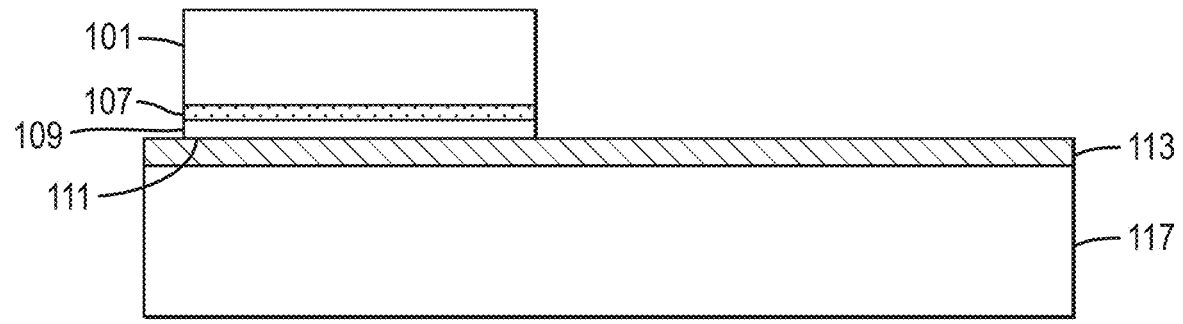

Referring to FIGS. 1E and 1F, a handle substrate 117 having a surface 115 is provided. Handle substrate 117 may comprise a single crystal, a polycrystalline material, or an amorphous material. Handle substrate 117 may comprise, for example, sapphire, aluminum oxide, mullite, silicon, silicon nitride, germanium, gallium arsenide, silicon carbide, MgAl$_2$O$_4$ spinel, zinc oxide, indium phosphide, gallium nitride, indium nitride, gallium aluminum indium nitride, or aluminum nitride. Handle substrate 117 may comprise substantially the same composition as crystal 101. In one specific embodiment, handle substrate 117 comprises crystals that have been merged or tiled together using methods other than those provided by the present disclosure. For example, handle substrate 117 may be formed using at least one of the tiling methods disclosed by Dwilinski et al., U.S. Patent Application Publication No. 2008/0156254 or the method disclosed in U.S. patent application Ser. No. 12/635,645, filed on Dec. 10, 2009, which is incorporated by reference in its entirety. In a particular embodiment, handle substrate 117 comprises substantially the same composition as crystal 101 and has a crystallographic orientation within about 10 degrees, within about 5 degrees, within about 2 degrees, or within about 1 degree of that of crystal 101. Handle substrate 117 may comprise a glass. Handle substrate 117 may comprise an oxide, nitride, or oxynitride of at least one of Si, Ge, Sn, Pb, B, Al, Ga, In, Tl, P, As, Sb, Pb, Li, Na, K, Rb, Cs, Mg, Ca, Sr, Ba, Y, Ti, Zr, Hf, Mn, Zn, and Cd. In one specific embodiment, handle substrate 117 comprises borophosphosilicate glass. Handle substrate 117 may be characterized by a thermal expansion coefficient parallel to surface 115 between room temperature and about 700 degrees Celsius that is between about 2.5×10$^{-6}$ K$^{-1}$ and about 7×10$^6$ K$^{-1}$. Handle substrate 117 may have a thermal expansion coefficient parallel to surface 115 between room temperature and about 700 degrees Celsius that is between about 5.5×10$^{-6}$ K$^{-1}$ and about 6.5×10$^{-6}$ K$^{-1}$. Handle substrate 117 may have a softening point, that is, where the viscosity has a value of about 10$^8$ Poise, at a temperature between about 500 degrees Celsius and about 1400 degrees Celsius. Handle substrate 117 may have a glass transition temperature between about 600 degrees Celsius and about 1200 degrees Celsius. Handle substrate 117 may have a softening point, that is, where its viscosity is characterized by a value of about 10 Poise, at a temperature between about 600 degrees Celsius and about 900 degrees Celsius. Handle substrate surface 115 may be optically flat, with a deviation from flatness less than 1 micron, less than 0.5 micron, less than 0.2 micron, less than 0.1 micron, or less than 0.05 micron. Handle substrate surface 115 may be smooth, with a root-mean-square roughness less than 5 nanometers, less than 2 nanometers, less than 1 nanometer, less than 0.5 nanometer, less than 0.2 nanometer, less than 0.1 nanometer, or less than 0.05 nanometer, measured over an area of at least 10 microns×10 microns.

An adhesion layer 113 may be deposited on surface 115 of handle substrate 117. Adhesion layer 113 may comprise at least one of SiO$_2$, GeO$_2$, SiN$_x$, AlN$_x$, or B, Al, Si, P, Zn, Ga, Si, Ge, Au, Ag, Ni, Ti, Cr, Zn, Cd, In, Sn, Sb, Tl, W, In, Cu, or Pb, or an oxide, nitride, or oxynitride thereof. Adhesion layer 113 may further comprise hydrogen. The adhesion layer 113 may be deposited by thermal evaporation, electron-beam evaporation, sputtering, chemical vapor deposition, plasma-enhanced chemical vapor deposition, electroplating, or the like, or by thermal oxidation of a deposited metallic film. The thickness of adhesion layer 113 may, for example, between about 1 nanometer and about 10 microns, or between about 10 nanometers and about 1 micron. Adhesion layer 113 may comprise a non-homogenous composition. In some embodiments, adhesion layer 113 comprises a stack of thin films of varying compositions or a film of graded or continuously-varying composition. In some embodiments, adhesion layer 113 or at least one thin film contained within adhesion layer 113 is laterally non-uniform. In some embodiments, adhesion layer 113 or at least one thin film contained within comprises an array of dots, squares, rectangle, lines, a grid pattern, or the like. The composition of adhesion layer 113 may be chosen so as to undergo nascent melting at a temperature below about 300 degrees Celsius, below about 400 degrees Celsius, or below about 500 degrees Celsius. The composition of adhesion layer 113 may be chosen so as to have a melting point above about 600 degrees Celsius, above about 700 degrees Celsius, above about 800 degrees Celsius, or above about 900 degrees Celsius. The composition and structure of adhesion layer 113 may be chosen so as to undergo nascent melting at a temperature below about 300 degrees Celsius, below about 400 degrees Celsius, below about 500 degrees Celsius, or below about 600 degrees Celsius, then, following a thermal treatment at a temperature below the solidus temperature, to remain unmelted, or with a volume fraction of melt below about 20%, below about 10%, or below about 5%, at a temperature above about 600 degrees Celsius, above about 700 degrees Celsius, above about 800 degrees Celsius, or above about 900 degrees Celsius. In some embodiments, an adhesion layer is deposited on surface 105 of nitride crystal 101 or on surface 111 of high quality epitaxial layer 109 (not shown). The adhesion layer(s) may be annealed, for example, to a temperature between about 300 degrees Celsius and about 1,000 degrees Celsius. In some embodiments, an adhesion layer is deposited on surface 105 of crystal 101 and annealed prior to forming an implanted/damaged layer by ion implantation. In some embodiments, at least one adhesion layer is chemical-mechanically polished. In a particular embodiment, the root-mean-square surface roughness of at least one adhesion layer may be below about 0.5 nanometer, or below about 0.3 nanometer over a 20×20 $\mu m^2$ area. As shown in FIG. 1E, nitride crystal 101 having surface 105 and implanted/damaged region 103 may be affixed to adhesion layer 113 overlying handle substrate 117.

Referring to FIGS. 1E and 1F, surface 105 or 111 of nitride crystal 101, surface 111 of high quality epitaxial layer 109 overlying release layer 107, or an adhesion layer placed thereupon, may be placed in contact with adhesion layer 113 and/or with the surface 115 of the handle substrate 117 and bonded. In one specific embodiment, the bonding comprises wafer bonding. In another specific embodiment, the bonding comprises a eutectic die attach or die bonding operation. In a particular embodiment, the bonding operation is performed in a clean room, with less than 10,000, less than 1,000, less than 100, or less than 10 particles per cubic centimeter in the air. Particles may be removed from at least one of the surfaces immediately prior to bonding by spraying, brushing, or rinsing with ionized nitrogen, a $CO_2$ jet, $CO_2$ snow, high-resistivity water, an organic solvent, such as methanol, ethanol, isopropanol, acetone, or the like. In some embodiments, surface 111 of high quality epitaxial layer 109, or the surface of an adhesion layer placed thereupon, and corresponding surfaces are brought into contact while immersed in a liquid. Optionally, at least one of the surfaces is exposed to a plasma to enhance bonding.

The positional and orientational accuracy of the placement of nitride crystal 101 with respect to handle substrate 117 may be precisely controlled. In one specific embodiment, nitride crystal is placed on handle substrate 117 by a pick and place machine, or robot, or a die attach tool. Nitride crystal 101 may be picked up by a vacuum chuck, translated to the desired position above handle substrate 117 by a stepper-motor-driven x-y stage, re-oriented, if necessary, by a digital-camera-driven rotational drive, and lowered onto the handle substrate. The positional accuracy of placement may be better than 50 microns, better than 30 microns, better than 20 microns, better than 10 microns, or better than 5 microns. The orientational accuracy of placement may be better than 5 degrees, better than 2 degrees, better than 1 degree, better than 0.5 degree, better than 0.2 degree, better than 0.1 degree, better than 0.05 degree, better than 0.02 degree, or better than 0.01 degree. In another specific embodiment, block 112, attached to nitride crystal 101, is placed in a kinematic mount. The kinematic mount establishes orientational accuracy with respect to handle substrate 117 that is better than 1 degree, better than 0.5 degree, better than 0.2 degree, better than 0.1 degree, better than 0.05 degree, better than 0.02 degree, or better than 0.01 degree. Nitride crystal 101, block 112, and the kinematic mount may then be positioned with respect to handle substrate 117 with submicron accuracy using an x-y stage similar to that in a stepper photolithography tool, using stepper motors in conjunction with voice coils. In some embodiments, the azimuthal crystallographic orientations of crystal 101 and handle substrate 117 are equivalent to within about 10 degrees, within about 5 degrees, within about 2 degrees, or within about 1 degree.

Nitride crystal 101 may be pressed against handle substrate 117 with a pressure between about 0.001 megapascals and about 100 megapascals. In some embodiments, van der Waals forces or capillarity associated with nascent melting of the adhesion layer(s) are sufficient to obtain a good bond and very little or no additional applied force is necessary. Nitride crystal 101 and handle substrate 117 may be heated to a temperature between about 30 degrees Celsius and about 950 degrees Celsius, between about 30 degrees Celsius and about 400 degrees Celsius, between about 30 degrees Celsius and about 200 degrees Celsius to strengthen the bond. In some embodiments, heating of nitride crystal 101 and handle substrate 117 is performed while they are placed in mechanical contact and/or mechanically loaded against one another.

In some embodiments, at least the surface region of bonded nitride crystal 101 having implanted/damaged region 103 and handle substrate 117 are heated to a temperature between about 200 degrees Celsius and about 800 degrees Celsius or between about 500 degrees Celsius and about 700 degrees Celsius to cause micro-bubbles, micro-cracks, micro-blisters, or other mechanical flaws within region 103. In one specific embodiment, surface 105 or high quality epitaxial layer 109 is heated by means of optical or infrared radiation through handle substrate 117, and the distal portion of crystal 101, which may be in contact with block 112 (not shown), may remain less than about 300 degrees Celsius, less than about 200 degrees Celsius, or less than about 100 degrees Celsius. In some embodiments, mechanical energy may be provided instead of or in addition to thermal energy. In some embodiments, an energy source such as a pressurized fluid is directed to a selected region, such as an edge, of bonded nitride crystal 101 to initiate a controlled cleaving action within region 103. After the application of energy, the distal portion of nitride crystal 101 is removed, leaving a proximate portion of nitride crystal 101 bonded to handle substrate 117. In some embodiments, distal portion of nitride crystal 101 remains bonded to block 112 (not shown). In some embodiments, the newly exposed surface of distal portion of nitride crystal 101 is polished, dry-etched, or chemical-mechanically polished. Care is taken to maintain the surface crystallographic orientation of the newly exposed surface of distal portion of nitride crystal 101 the same as the original orientation of surface 105. In some embodiments, an adhesion layer is deposited on the newly exposed surface of distal portion of crystal 101. In some embodiments, the adhesion layer is chemical-mechanically polished.

Figure 1G:
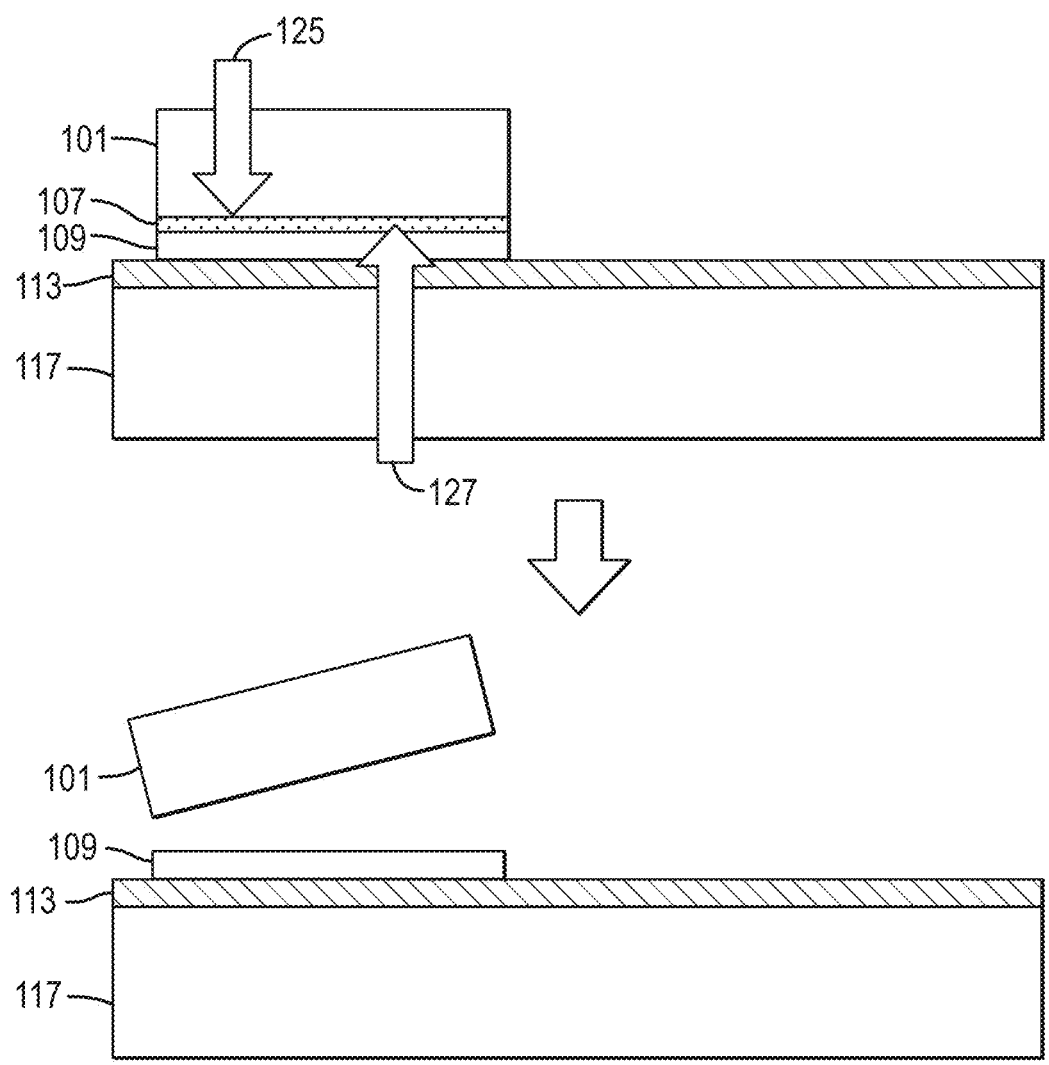

Referring to FIG. 1G, in some embodiments, nitride crystal 101 is separated from high quality epitaxial layer 109 and handle substrate 117 by laser irradiation. The release layer 107 may be illuminated through nitride crystal 101 by through-crystal laser radiation 125 having a wavelength at which the release layer has an optical absorption coefficient greater than 1,000 cm$^{-1}$ and the nitride crystal is substantially transparent, with an optical absorption coefficient less than 50 cm$^{-1}$. In another set of embodiments, the release layer is illuminated through handle substrate 117 and adhesion layer 113 by through-handle laser radiation 127 having a wavelength at which the release layer has an optical absorption coefficient greater than 1,000 cm$^{-1}$ and the handle substrate is substantially transparent, with an optical absorption coefficient less than 50 cm$^{-1}$. Absorption of the laser energy by the release layer 107 occurs on a very short length scale, causing considerable local heating. Such local heating causes partial or complete decomposition of the release layer and/or a thin portion of the nitride crystal in direct contact with the release layer, forming metal and N$_2$, which may occur as a thin layer or as micro- or nano-bubbles. Such methods are disclosed, for example, in U.S. Pat. No. 8,148,801. The thin layer or micro- or nano-bubbles of N$_2$ mechanically weakens the interface between the nitride crystal and the high quality epitaxial layer, enabling facile separation of the nitride crystal from the high quality epitaxial layer, which is in turn bonded to the handle substrate. The optimal degree of weakening of the interface, without causing undesired damage to the high quality epitaxial layer or the handle substrate, is achieved by adjusting the die temperature, the laser power, the laser spot size, the laser pulse duration, and/or the number of laser pulses. The laser fluence to effect separation may be between 300 and 900 millijoules per square centimeter or between about 400 mJ/cm$^{-2}$ and about 750 mJ/cm$^{-2}$. The uniformity of the laser beam may be improved by inclusion of a beam homogenizer in the beam path, and the beam size may be about 4 mm by 4 mm. In some embodiments, the laser beam is scanned or rastered across the release layer rather than being held stationary. Separation may be performed at a temperature above the melting point of the metal produced by decomposition, e.g., above about 30 degrees Celsius in the case of gallium metal.

In some embodiments, multiple release layers and high quality epitaxial layers are present in the wafer-bonded stack. In this case laser illumination is preferably applied through the handle substrate, and the fluence controlled so that substantial decomposition takes place only within the release layer closest to the handle substrate and the remaining release layers and high quality epitaxial layers remain bonded to the nitride crystal after liftoff.

After separation of the high quality epitaxial layer from the nitride crystal, any residual gallium, indium, or other metal or nitride on the newly exposed back surface of the high quality epitaxial layer, on nitride crystal 101, or on another newly-exposed high quality epitaxial layer still bonded to nitride crystal 101 may be removed by treatment with at least one of hydrogen peroxide, an alkali hydroxide, tetramethylammonium hydroxide, an ammonium salt of a rare-earth nitrate, perchloric acid, sulfuric acid, nitric acid, acetic acid, hydrochloric acid, and hydrofluoric acid. The surfaces may be further cleaned or damage removed by dry-etching in at least one of Ar, Cl$_2$, and BCl$_3$, by techniques such as chemically-assisted ion beam etching (CAIBE), inductively coupled plasma (ICP) etching, or reactive ion etching (RIE). The surfaces may be further treated by chemical mechanical polishing.

In some embodiments, traces of the release layer may remain after laser liftoff or etching from the edges of the release layer. Residual release layer material may be removed by photoelectrochemical etching, illuminating the back side of the high quality epitaxial layer or the front side of nitride crystal 101 or of the front side of the outermost high quality epitaxial layer still bonded to nitride crystal 101 with radiation at a wavelength at which the release layer has an optical absorption coefficient greater than 1,000 cm$^{-1}$ and the high quality epitaxial layer is substantially transparent, with an optical absorption coefficient less than 50 cm$^{-1}$.

Figure 1H:
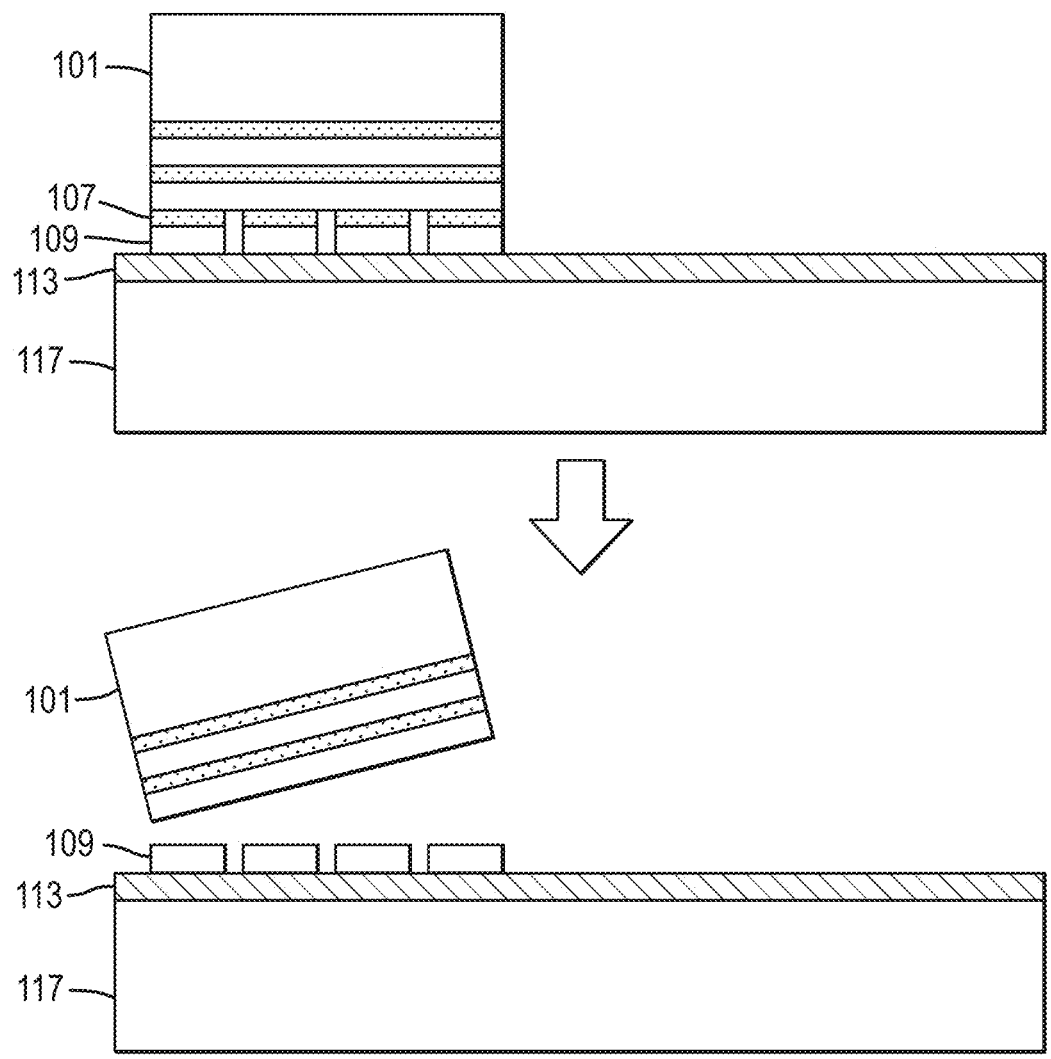

Referring to FIG. 1H, in another set of embodiments, the high quality epitaxial layer bonded to the handle substrate is separated from the nitride crystal by means of chemical etching of the release layer. FIG. 1H shows nitride crystal 101 having alternate release layers 107 and high quality epitaxial layers 109 bonded to adhesion layer 113 overlying handle substrate 117. Nitride crystal 101 and one or more of release layers 107 and/or high quality epitaxial layers 109 can be removed from a high quality epitaxial layer 109 bonded to adhesion layer 113 overlying handle substrate 117. In one embodiment, one or more edges of the release layer is treated with at least one of 1,2-diaminoethane, hydrogen peroxide, an alkali hydroxide, tetramethylammonium hydroxide, an ammonium salt of a rare-earth nitrate, perchloric acid, sulfuric acid, nitric acid, acetic acid, hydrochloric acid, and hydrofluoric acid. In one specific embodiment, the edge of the release layer is etched by treatment in a mixture of 200 milliliters of deionized water, 50 grams of diammonium cerium nitrate, Ce(NH$_4$)$_2$(NO$_3$)$_6$, and 13 milliliters of perchloric acid, HClO$_4$, at approximately 70 degrees Celsius. At least one edge of the release layer is etched away, mechanically weakening the interface between the nitride base crystal and the high quality epitaxial layer and enabling facile separation of the nitride base crystal from the high quality epitaxial layer, which is in turn bonded to at least one semiconductor device layer. The right degree of weakening of the interface, without causing undesired damage to the high quality epitaxial layer or the semiconductor structure, is achieved by adjusting the temperature and time of the chemical treatment. The time required for lateral etching of the release layer may be reduced by incorporating a pre-formed set of channels in the release layer. In the case that multiple, alternating release layers and high quality epitaxial layers are bonded to nitride crystal 101, transfer may be restricted to the outermost high quality epitaxial layer by utilizing etch channels that penetrate only the outermost high quality epitaxial layer.

In still another set of embodiments, the high quality epitaxial layer bonded to the handle substrate is separated from the nitride crystal by means of photoelectrochemical (PEC) etching of the release layer. For example, an InGaN layer or InGaN/InGaN superlattice may be deposited as the release layer. An electrical contact may be placed on the nitride crystal and the release layer illuminated with above-bandgap radiation, for example, by means of a Xe lamp and a filter to remove light with energy greater than the bandgap of the high quality epitaxial layer and/or the nitride crystal.

Figure 1I:
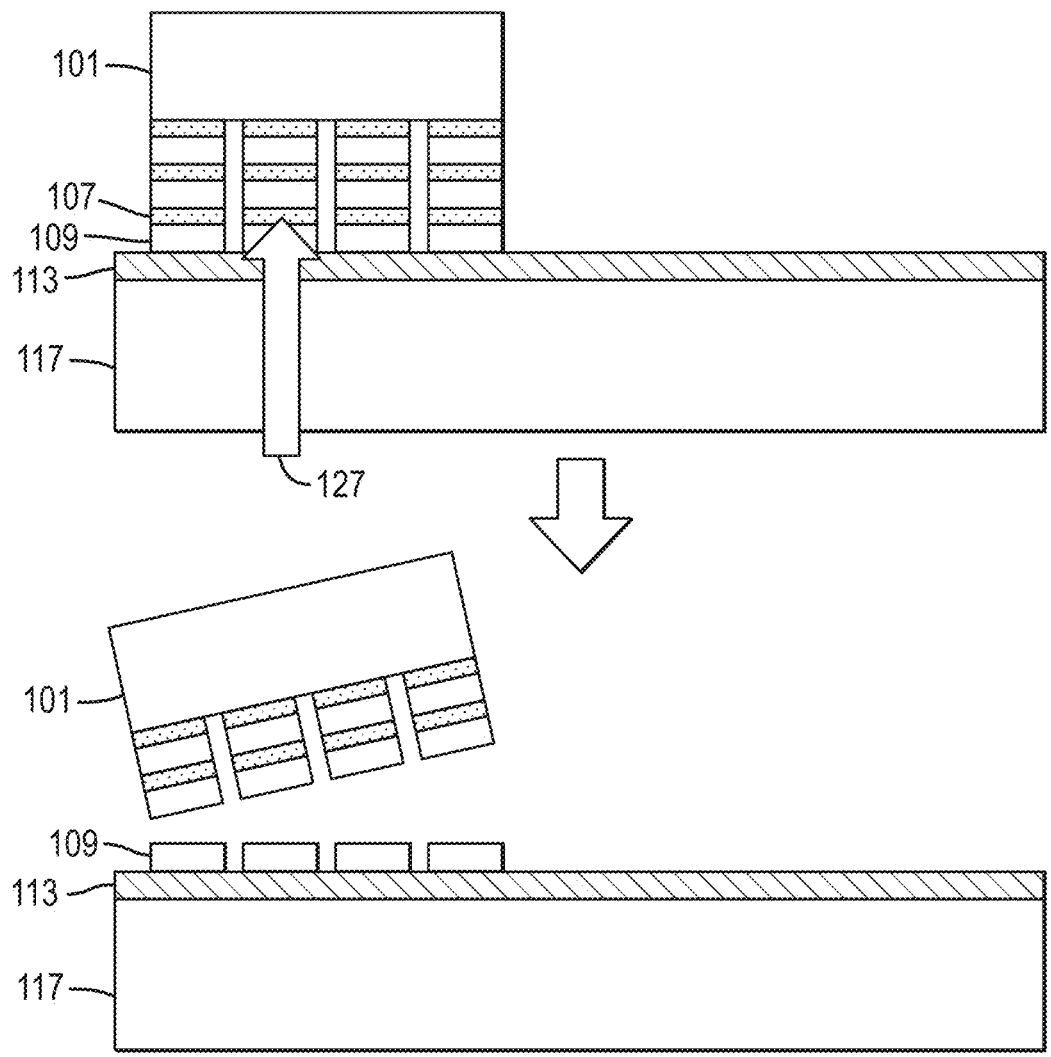

In one set of embodiments, illustrated schematically in FIG. 1I, the laser radiation 127 is provided through the handle substrate 117 and adhesion layer 113 and the intensity adjusted so that essentially all the light is absorbed by the release layer in closest proximity to the handle substrate. At least one edge of a release layer 107 is exposed to an electrolyte, for example, a stirred, 0.004M HCl solution. The time required for lateral etching of the release layer 107 may be reduced by incorporating a pre-formed set of channels in the release layer. In the case that multiple, alternating release layers and high quality epitaxial layers 109 are bonded to nitride crystal 101, transfer may be restricted to the outermost high quality epitaxial layer even when the etch channels penetrate multiple high quality epitaxial layers by ensuring that the light is fully absorbed by only the outermost release layer. In one set of embodiments, GaN is deposited as the release layer and lattice-matched AlInN comprises the high quality epitaxial layer, and the wavelength range of the illumination is chosen so that electron-hole pairs are generated in the GaN but not in the AlInN.

In yet another set of embodiments, the high quality epitaxial layer bonded to the handle substrate is separated from the nitride crystal by means of selective oxidation followed by chemical etching of the release layer. For example, at least one release layer comprising $Al_xIn_yGa_{1-x-y}N$, where $0 \le x$, $x+y \le 1$, $0 \le y \le 1$, or $Al_{0.83}In_{0.17}N$, lattice matched to GaN, may be selectively oxidized. The selective oxidation may be performed by exposing at least one edge of the Al-containing release layer to a solution comprising nitriloacetic acid (NTA) and potassium hydroxide at a pH of approximately 8 to 11 and an anodic current of approximately 20 $\mu A/cm^{-2}$, to about 0.1 $kA/cm^{-2}$. The oxide layer may then be removed by treatment in a nitric acid solution at approximately 100 degrees Celsius. The time required for lateral etching of the release layer may be reduced by incorporating a pre-formed set of channels in the release layer. In the case that multiple, alternating release layers and high quality epitaxial layers are bonded to nitride crystal 101, transfer may be restricted to the outermost high quality epitaxial layer by utilizing etch channels that penetrate only the outermost high quality epitaxial layer.

Figure 1J:
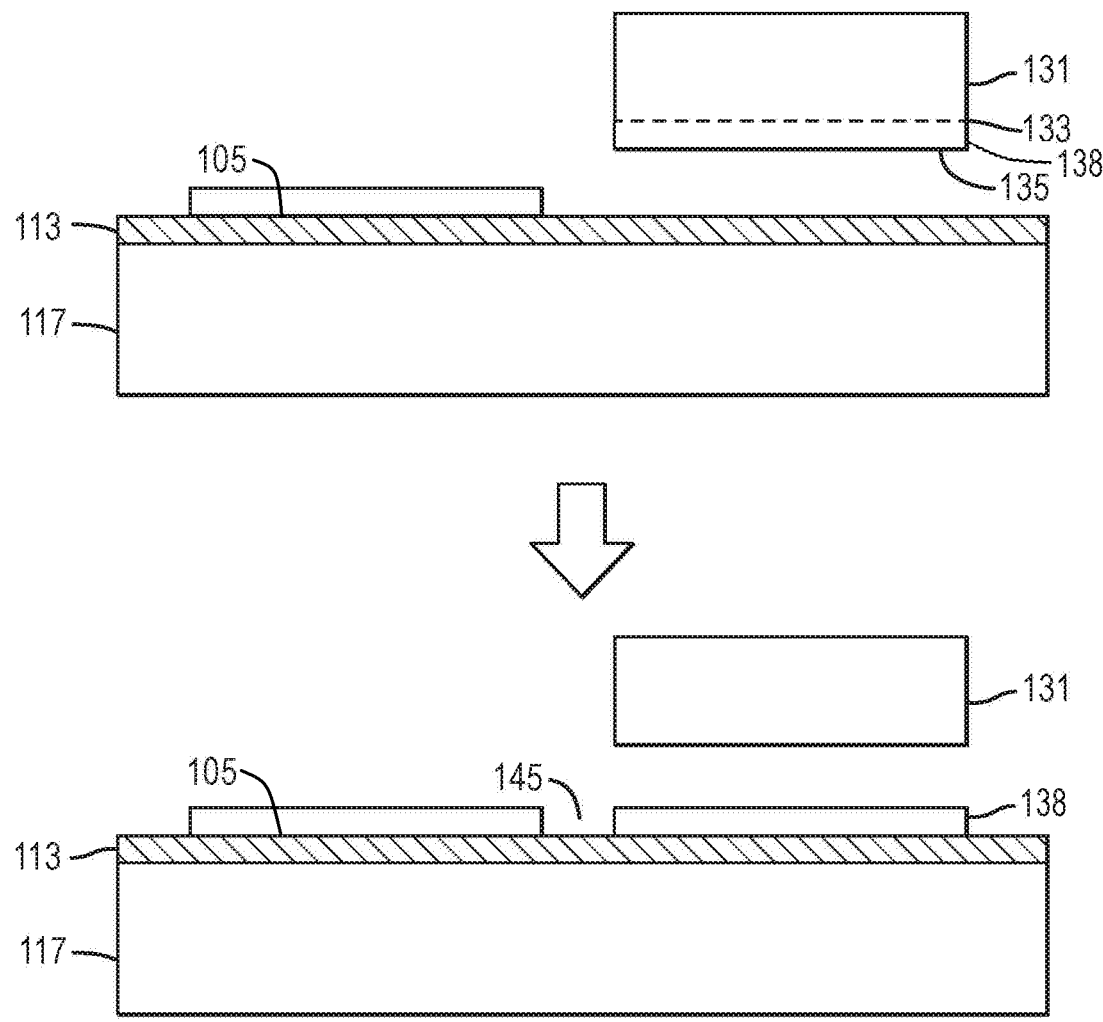
Figure 1K:
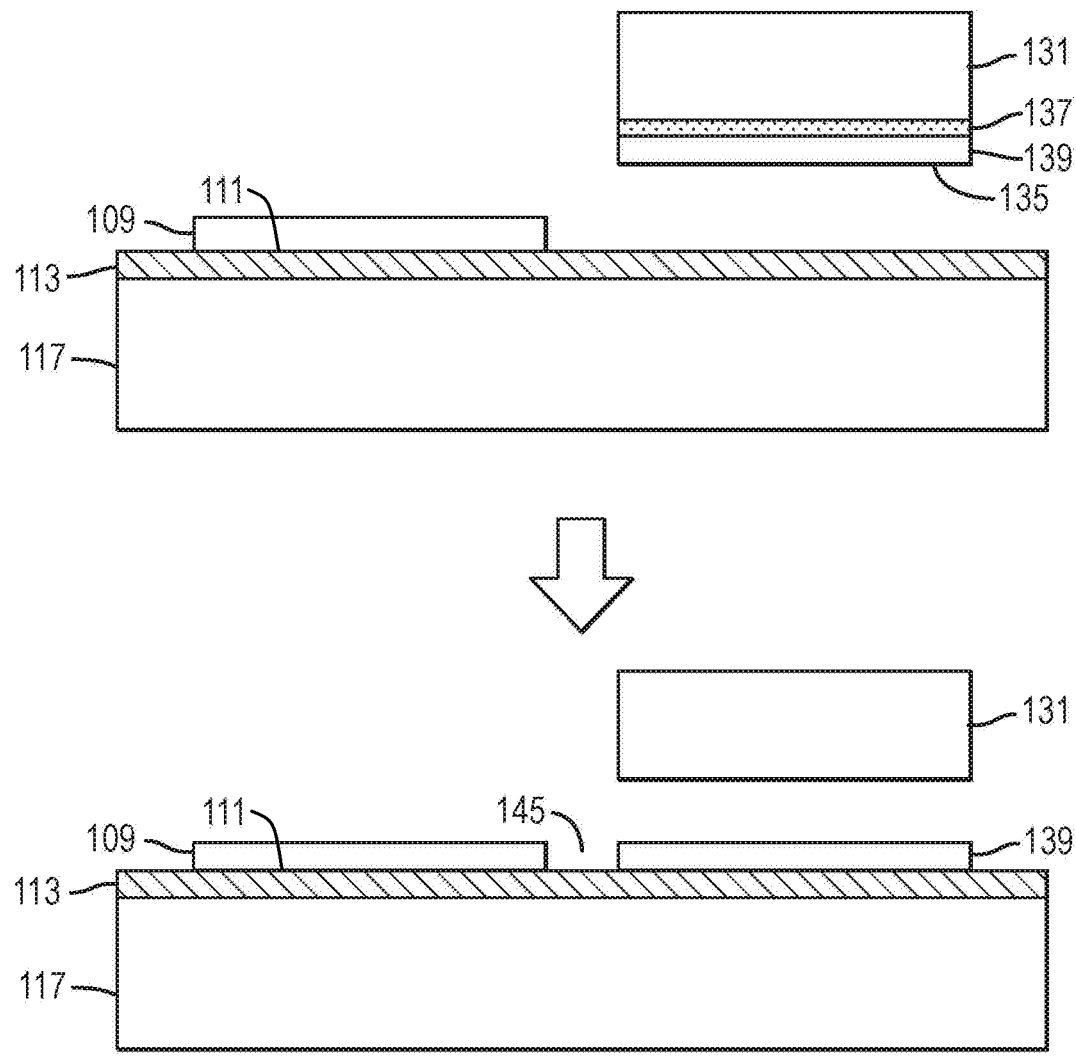

Referring to FIGS. 1J and 1K, the bonding process is repeated. A second nitride crystal 131 having surface 135, or the distal portion of the first nitride crystal (not shown), is bonded in close proximity to the first nitride crystal or to the proximate portion of the first nitride crystal. The second nitride crystal 131 may have an ion-implanted, damaged region 133 or at least one release layer 137 and at least one high quality epitaxial layer 139, similar to the first nitride crystal. The second nitride crystal or the outer most high quality epitaxial layer on the second nitride crystal has a surface 135 wherein the crystallographic orientation is essentially identical to that of surface 105 of the nitride crystals 101 or to that of surface 111 of the first high quality epitaxial layer. In some embodiments, accurate equality between the surface orientation of the first and second nitride crystals is achieved by growing each crystal to an accurately flat on-axis orientation, for example, (0 0 0 1) Ga-polar, (0 0 0 –1) N-polar, {1 0 –1 0} non-polar, or {1 0 –1 ±1} semi-polar. If the first and/or second nitride crystals are polished, dry-etched, or chemical-mechanically polished, care is taken so as not to significantly alter the surface orientation of either. In some embodiments, accurate equality between the surface orientation of the first and second nitride crystals is achieved by removing a uniform, thin proximate portion of the first nitride crystal to form the second nitride crystal. If the distal portion of the first nitride crystal, used also as the second nitride crystal, is polished, dry-etched, or chemical-mechanically polished, care is taken so as not to significantly alter the surface orientation. In other embodiments, accurate equality between the surface orientation of the first and second nitride crystals is achieved by removing a uniform, thin high quality epitaxial layer from the first nitride crystal to form the second nitride crystal. If the distal portion of the first nitride crystal, used also as the second nitride crystal, is polished, dry-etched, or chemical-mechanically polished, care is taken so as not to significantly alter the surface orientation. For example, the crystallographic orientations of first surfaces 105 or 111 and 135, respectively, of the outermost surface or high quality epitaxial layers on the first and second nitride crystals may be identical to less than 0.5 degree, less than 0.2 degree, less than 0.1 degree, less than 0.05 degree, less than 0.02 degree, or less than 0.01 degree. In still other embodiments, accurate equality between the surface orientation of the first and second nitride crystals is achieved by very careful crystallographic orientation and grinding and/or polishing, for example, using a high-precision goniometer. After bonding, a distal portion of the second nitride crystal may be removed. Gap 145 between the edges of two or more adjacent nitride crystals or proximate portions thereof may be less than 1 millimeter, less than 100 microns, less than 50 microns, less than 20 microns, less than 10 microns, less than 5 microns, less than 2 microns, or less than 1 micron. The bonding process may be repeated more than two, more than 4, more than 8, more than 16, more than 32, or more than 64 times.

Figure 2:
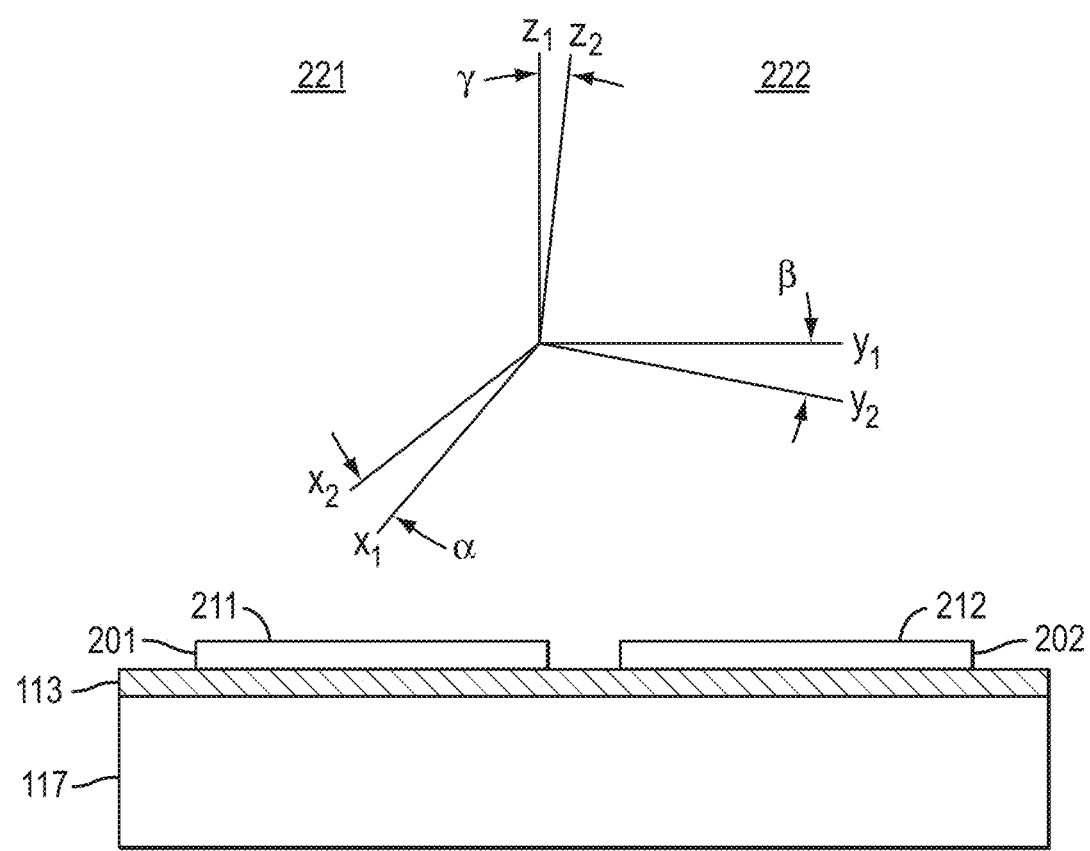
FIG. 2 is a diagram illustrating the crystallographic misorientation between two adjacent wafer-bonded crystals.
Figure 3A:
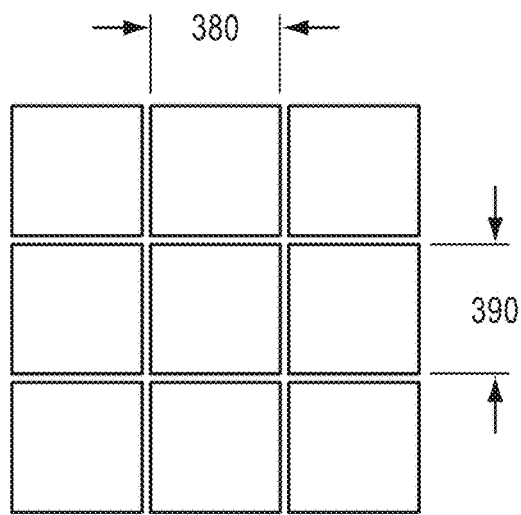
FIGS. 3A, 3B, 3C, and 3D are diagrams illustrating arrangements of tiled crystals.
Figure 3B:
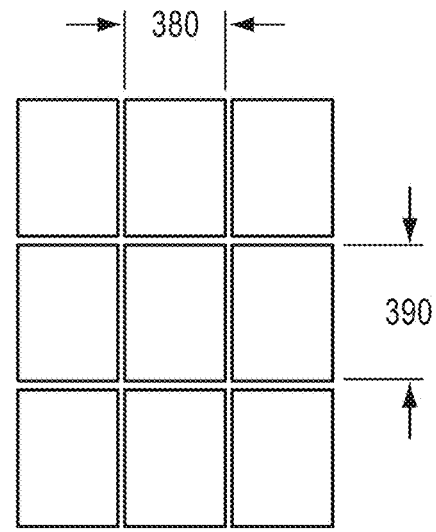
Figure 3C:
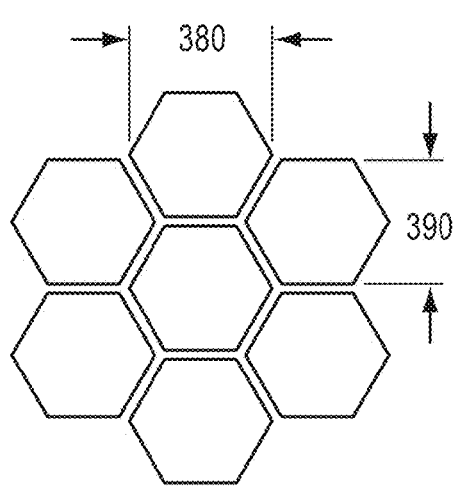
Figure 3D:
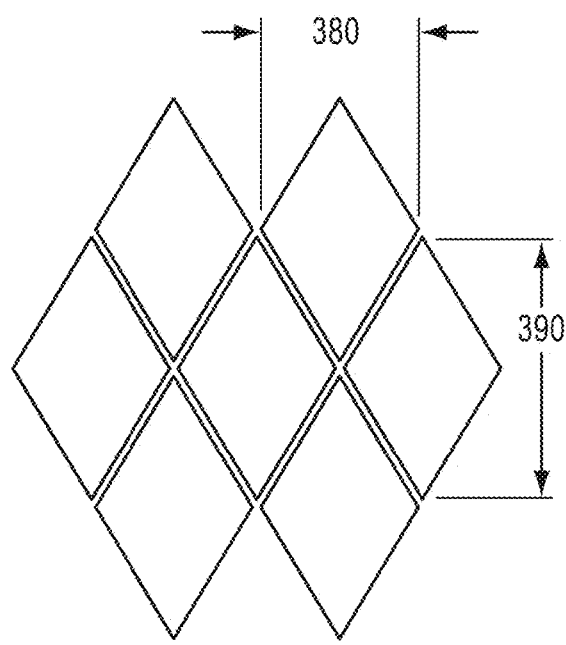

The placement of the second nitride crystal is performed in such a way that the crystallographic orientations between the from the first nitride crystal and the second nitride crystal, or the high quality epitaxial layers thereupon, are very nearly identical. Referring to FIG. 2, first coordinate system 221 ($x_1$ $y_1$ $z_1$) represents the crystallographic orientation of the first nitride crystal or of the proximate portion of the high quality epitaxial layer of the first nitride crystal 201, where $z_1$ is the negative surface normal of the nominal orientation of the surface 211 of first nitride crystal 20, and $x_1$ and $y_1$ are vectors that are orthogonal to $z_1$. For example, if surface 211 has a (0 0 0 1) orientation, then $z_1$ is a unit vector along [0 0 0 –1], and $x_1$ and $y_1$ may be chosen to be along [1 0 –1 0] and [1 –2 1 0], respectively. If surface 211 has a (1 0 –1 0) orientation, then $z_1$ is a unit vector along [–1 0 1 0] and $x_1$ and $y_1$ may be chosen to be along [1 –2 1 0] and [0 0 0 1], respectively. Similarly, second coordinate system 222 ($x_2$ $y_2$ $z_2$) represents the crystallographic orientation of the second nitride crystal or of the proximate portion of the high quality epitaxial layer from the second nitride crystal 202, where $z_2$ is the negative surface normal of the nominal orientation of surface 212 of second nitride crystal 202 and $x_2$ and $y_2$ are vectors that are orthogonal to $z_2$, where the same convention is used for the crystallographic directions corresponding to ($x_2$ $y_2$ $z_2$) as for ($x_1$ $y_1$ $z_1$). The crystallographic misorientation between the surface of first nitride crystal and the surface of second nitride crystal may be specified by the three angles $\alpha$, $\beta$, and $\gamma$, where $\alpha$ is the angle between $x_1$ and $x_2$, $\beta$ is the angle between $y_1$ and $y_2$, and $\gamma$ is the angle between $z_1$ and $z_2$. Because the surface orientations of the first and second nitride crystals are nearly identical, the polar misorientation angle $\gamma$ is very small, for example, less than 0.5 degree, less than 0.2 degree, less than 0.1 degree, less than 0.05 degree, less than 0.02 degree, or less than 0.01 degree. Because of the precise control in the orientation of the nitride crystal during placement, the misorientation angles α and β are also very small, for example, less than 1 degree, less than 0.5 degree, less than 0.2 degree, less than 0.1 degree, less than 0.05 degree, less than 0.02 degree, or less than 0.01 degree. Typically, γ will be less than or equal to α and β. The crystallographic misorientation between additional, adjacent nitride crystals is similarly very small. However, the crystallographic misorientation angles α, β, and γ may be detectable by x-ray measurements and may be greater than about 0.005 degree, greater than about 0.02 degree, greater than about 0.05 degree, greater than about 0.1 degree, greater than 0.3 degree, or greater than 0.5 degree.

Referring to FIGS. 3A-3D, after placing and bonding a number of similarly-sized and similarly-shaped crystals, portions thereof, or high quality epitaxial layers from one or more nitride crystals, a tiled arrangement of high quality epitaxial layers may be formed, with each adjacent pair on the handle substrate being accurately aligned crystallographically with its neighbor(s). The tiling pattern may be, for example, (a) square (FIG. 3A), (b) rectangular (FIG. 3B), (c) hexagonal (FIG. 3C), (d) rhombal (FIG. 3D), or (e) irregular (not shown). Other arrangements are also possible. The gaps between the edges of two or more adjacent high quality epitaxial layers may be less than 5 millimeters, less than 1 millimeter, less than 100 microns, less than 50 microns, less than 20 microns, less than 10 microns, less than 5 microns, less than 2 microns, or less than 1 micron. The crystals may have a first lateral dimension 380 and a second lateral dimension 390, the lateral dimensions defining a plane that is perpendicular to the thickness, where each of the first lateral dimension and the second lateral dimension may be at least about 0.5 millimeter, 1 millimeter, 2 millimeters, 4 millimeters, 5 millimeters, 10 millimeters, 15 millimeters, 20 millimeters, 25 millimeters, 35 millimeters, 50 millimeters, 75 millimeters, 100 millimeters, 150 millimeters, or can be at least about 200 millimeters.

In some embodiments, a similar set of nitride crystals or high quality epitaxial layers is wafer-bonded to the back surface of the handle substrate by an analogous procedure to that used to form the tile pattern of nitride crystals or high quality epitaxial layers on the front surface of the handle substrate. In a particular embodiment, the tile pattern on the back surface of the handle substrate is a mirror image of the tile pattern on the front surface of the handle substrate, with the front and back tile patterns in registry.

In one set of embodiments, the at least two nitride crystals or high quality epitaxial layers on the handle substrate are used as a substrate for fabrication of one or more devices.

The two or more tiled high quality epitaxial layers or crystals bonded to the handle substrate may be prepared for lateral growth for epitaxial growth and/or for fusion of the tiled crystals into a single larger crystal. The lateral crystal growth may be achieved by techniques such as molecular beam epitaxy (MBE), metalorganic chemical vapor deposition (MOCVD), hydride vapor phase epitaxy (HVPE), ammonothermal crystal growth, or crystal growth from a flux.

Figure 4A:
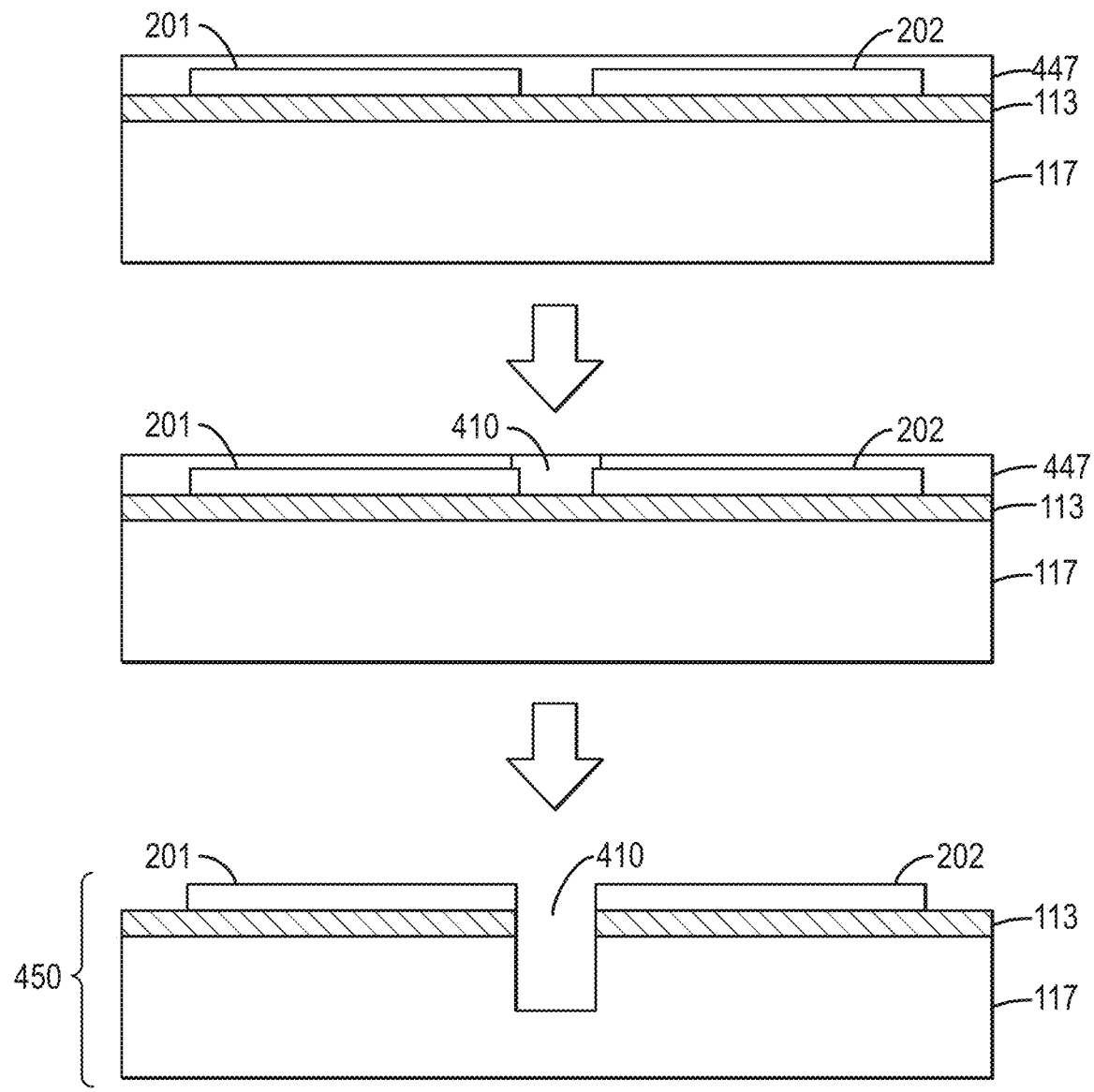
FIGS. 4A, 4B, 5, and 6 are diagrams illustrating a method for coalescing wafer-bonded crystals.
Figure 4B:
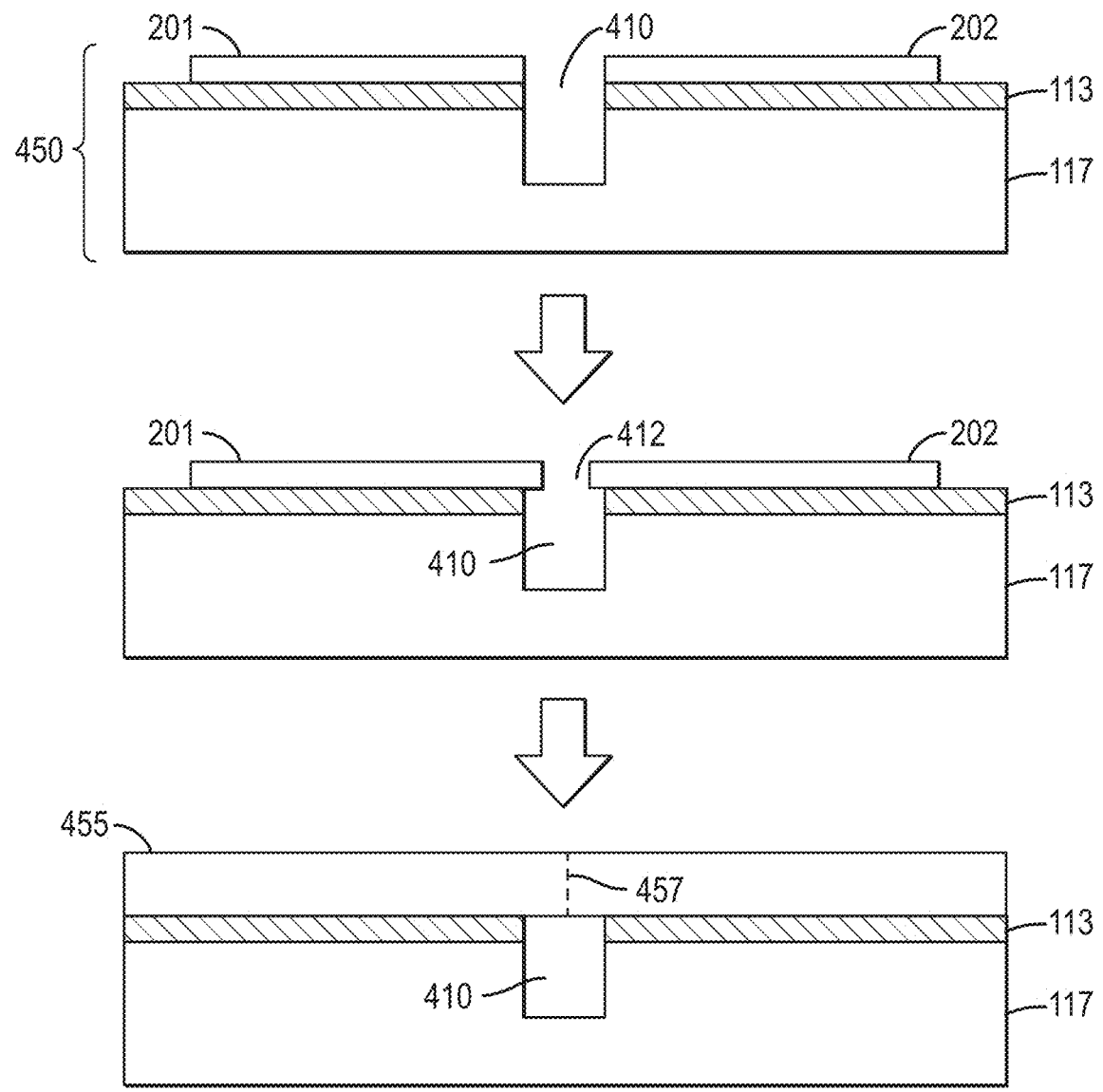

In some embodiments, the handle substrate is suitable for exposure to the epitaxial growth environment without further treatment. In some embodiments, a thermal treatment may be applied to increase the melting point of at least a portion of the adhesion layer(s). In some embodiments, growth may proceed more smoothly, with fewer stresses, if the gaps between adjacent nitride crystals are undercut. Referring to FIG. 4A, a photoresist 447 may be spun onto the bonded, tiled substrate comprising handle substrate 117, first nitride crystal 201, and second nitride crystal 202. Photoresist 447 may be exposed through a mask, etched, and an exposed channel 410 etched by dry etching, and the photoresist removed to form patterned nitride/handle substrate 450. In another embodiment, the gaps between the adjacent nitride crystals may be undercut or increased in depth by fast ion-beam etching, wire-sawing, sawing, or dicing. Referring to FIG. 4B, patterned nitride/handle substrate 450 may be used as a substrate for epitaxial nitride growth by MBE, MOCVD, HVPE, ammonothermal growth, or flux growth. FIG. 4B shows patterned nitride/handle substrate 450 comprising a first nitride crystal 201 and second nitride crystal 202 separated by channel 410 overlying adhesion layer 113 and handle substrate 117. Growth is performed as known in the art, and the at least two nitride crystals 201 and 202 grow both laterally and vertically to form a merged nitride crystal 455. Horizontal growth causes nitride crystal 201 and nitride crystal 202 to grow toward each other and separated by gap 412 over channel 410. Because of the very low crystallographic misorientation between nitride crystals 201 and 202, the coalescence front 457 may have a modest concentration of dislocations but a classical low angle grain boundary or tilt boundary may be difficult to detect. Threading dislocations, for example, edge dislocations, may be present at coalescence fronts 457, for example, with a line density that is less than about $1 \times 10^5$ cm$^{-1}$, less than about $3 \times 10^4$ cm$^{-1}$, less than about $1 \times 10^4$ cm$^{-1}$, less than about $3 \times 10^3$ cm$^{-1}$, less than about $1 \times 10^3$ cm$^{-1}$, less than about $3 \times 10^2$ cm$^{-1}$, or less than about $1 \times 10^2$ cm$^{-1}$. The density of dislocations along the coalescence fronts may be greater than 5 cm$^{-1}$, greater than 10 cm$^{-1}$, greater than 20 cm$^{-1}$, greater than 50 cm$^{-1}$, greater than 100 cm$^{-1}$, greater than 200 cm$^{-1}$, or greater than 500 cm$^{-1}$.

Figure 5:
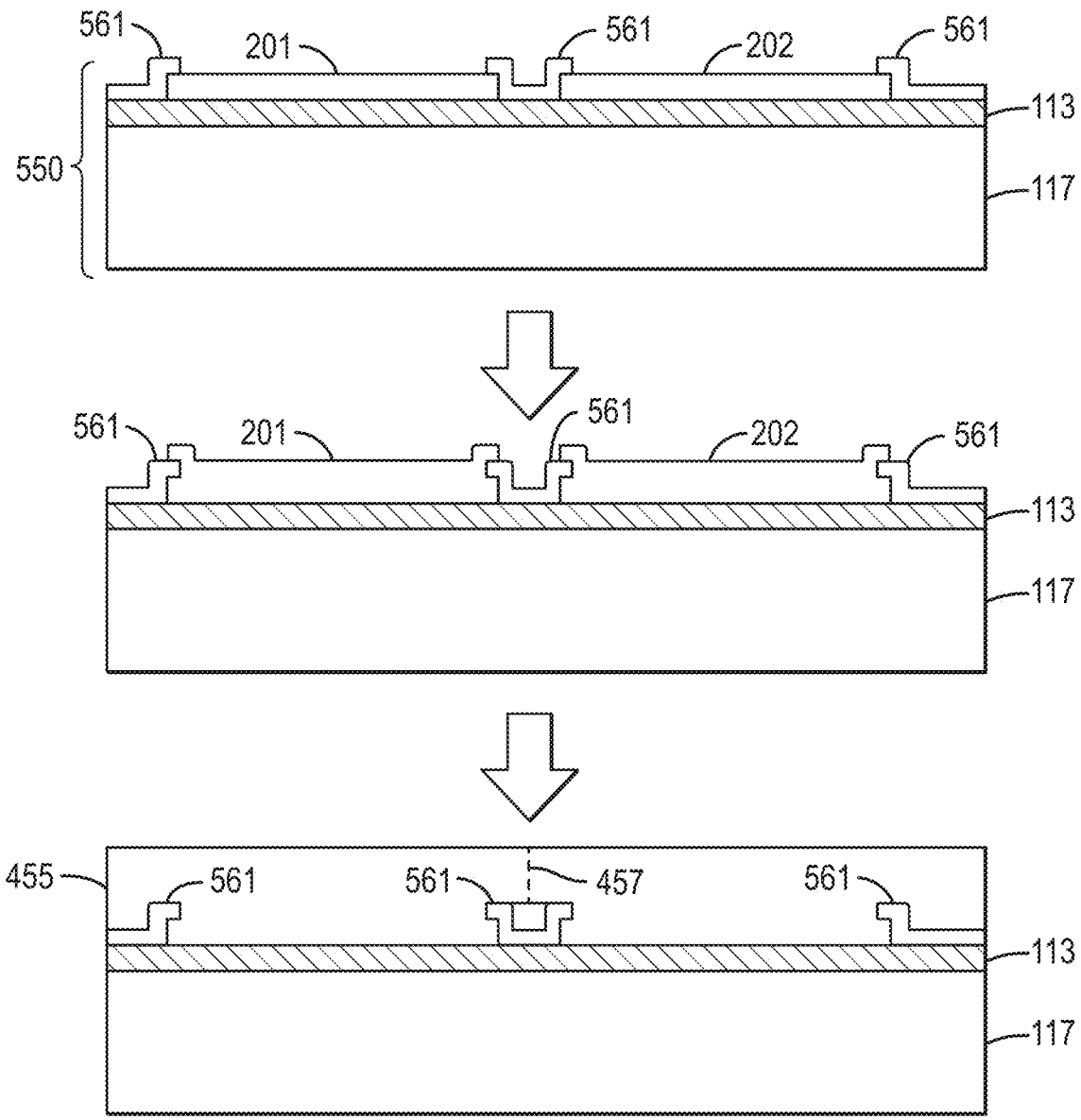

In some embodiments, the handle substrate and/or the adhesion layer may not be suitable for exposure to the epitaxial growth environment without further treatment. Exposed portions of the handle substrate may be coated with a suitable inert material. Referring to FIG. 5, first nitride crystal 201 and second nitride crystal 202 may be masked, for example, by a shadow mask or by photolithography with a photoresist, and the regions between the masked areas on the handle substrate 117 and/or adhesion layer 113 coated with inert coating 561. Inert coating 561 may comprise at least one of Ag, Au, Pt, Pd, Rh, Ru, Ir, Ni, Cr, V, Ti, Ta, SiO$_2$, SiN$_x$, or AlN. Inert coating 561 may further comprise an adhesion layer (not shown) in contact with the surface of handle substrate 117 and/or adhesion layer 113 comprising, for example, at least one of Ti, V, Cr, Al, Ni, B, Si, P, Zn, Ga, Si, Ge, Au, Ag, Zn, Cd, In, Sn, Sb, Tl, Ta, W, In, Cu, or Pb, or an oxide, nitride, or oxynitride thereof. Inert coating 561 may be deposited by sputtering, thermal evaporation, electron beam evaporation, chemical vapor deposition, plasma enhanced chemical vapor deposition, electroplating, or the like. Masked nitride/handle substrate 550 may be used as a substrate for epitaxial nitride growth by MBE, MOCVD, HVPE, ammonothermal growth, or flux growth. Flux growth may be performed, for example, using liquid Ga under a nitrogen pressure of 1-3 GPa, using an alloy comprising Ga and at least one alkali metal under a pressure of a nitrogen-containing gas at a pressure of 10 MPa to 200 MPa, or using one or more halide, nitride, or amide salts under a pressure of a nitrogen-containing gas at a pressure of 0.1 MPa to 200 MPa. Growth is performed as known in the art, and the at least two nitride crystals 201 and 202 grow both laterally and vertically to form a merged nitride crystal 455. Because of the very low crystallographic misorientation between nitride crystals 201 and 202, the coalescence front 457 may have a modest concentration of dislocations but a classical low angle grain boundary or tilt boundary may be difficult to detect.

Figure 6:
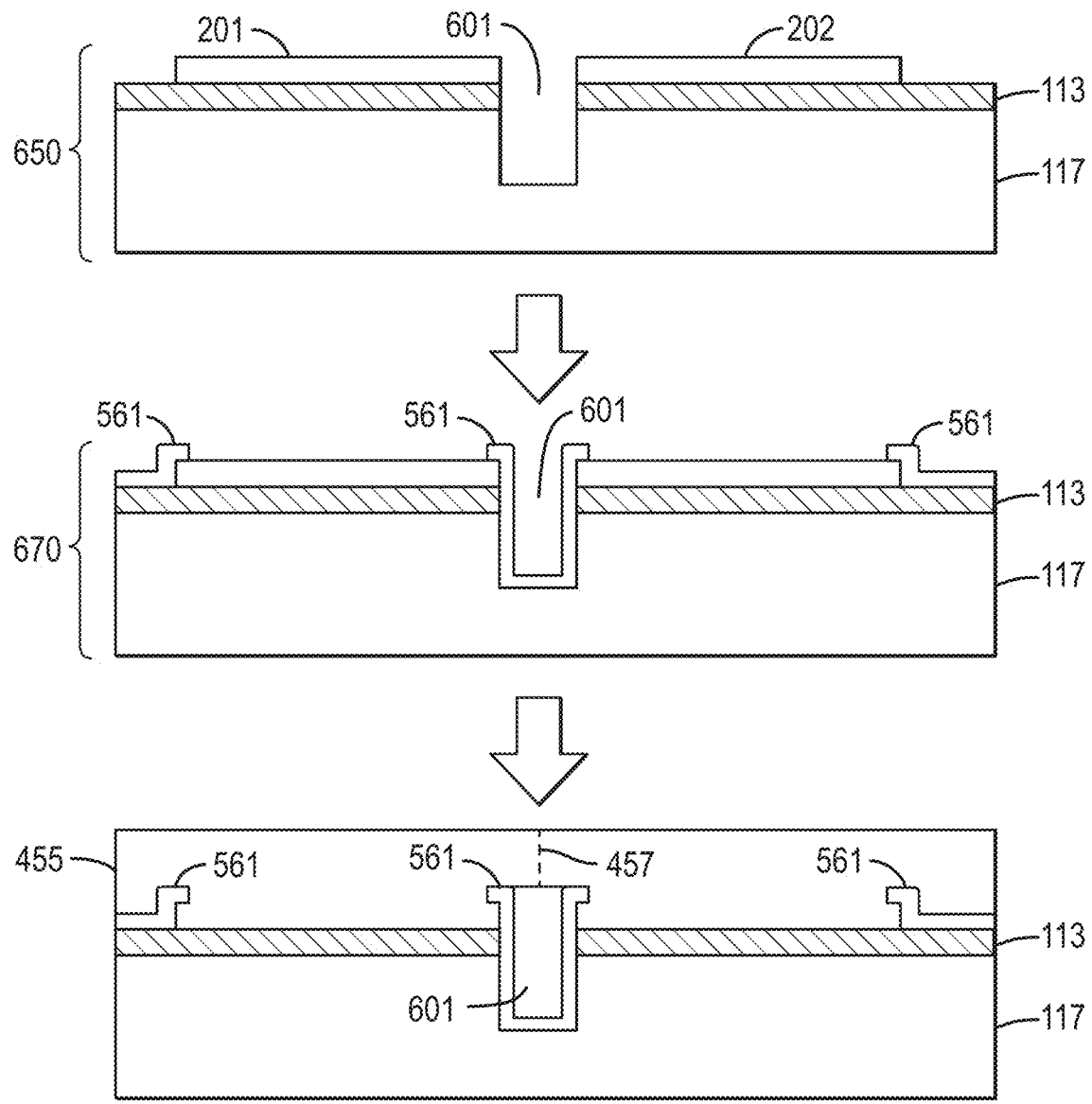
Figure 7A:
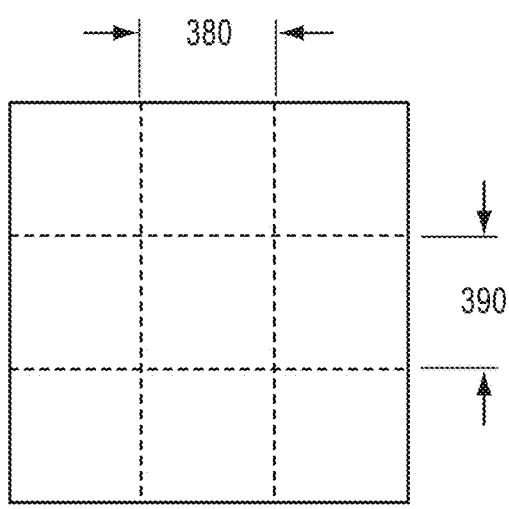
FIGS. 7A, 7B, 7C, and 7D are diagrams illustrating arrangements of merged crystals.
Figure 7B:
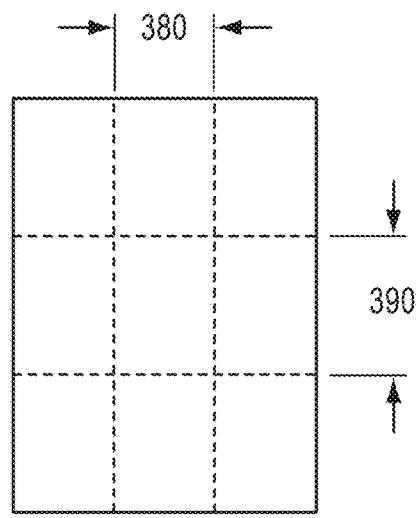
Figure 7C:
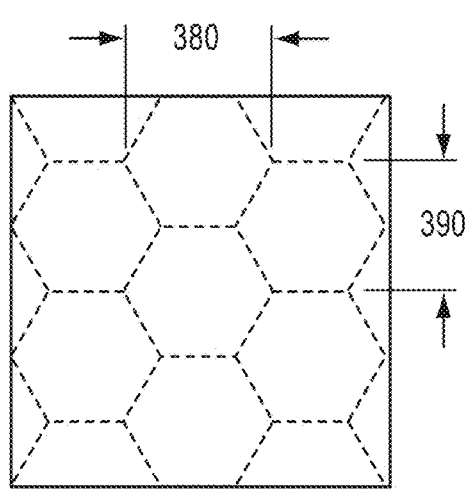
Figure 7D:
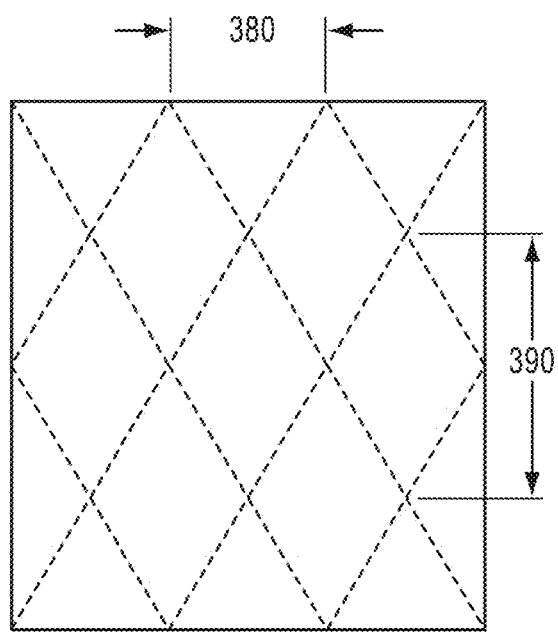

The etching/patterning and masking steps may be combined. Referring to FIG. 6, patterned nitride/handle substrate 650 having first nitride crystal 201 and second nitride crystal 202 with an etched gap 601 between them may be masked, for example, by a shadow mask or by photolithography with a photoresist, and the regions between the masked areas on handle substrate 117 and/or adhesion layer 113 coated with inert coating 561. Masked/patterned/etched nitride/handle substrate 670 may be used as a substrate for epitaxial nitride growth by MBE, MOCVD, HVPE, ammonothermal growth, or flux growth. Growth is performed as known in the art, and the at least two nitride crystals 201 and 202 grow both laterally and vertically to form a merged nitride crystal 455. Because of the very low crystallographic misorientation between nitride crystals 201 and 202, the coalescence front 457 may have a modest concentration of dislocations but a classical low angle grain boundary or tilt boundary may be difficult to detect. Threading dislocations, for example, edge dislocations, may be present at coalescence fronts 457, for example, with a line density that is less than about $1 \times 10^5$ $cm^{-1}$, less than about $3 \times 10^4$ $cm^{-1}$, less than about $1 \times 10^4$ $cm^{-1}$, less than about $3 \times 10^3$ $cm^{-1}$, less than about $1 \times 10^3$ $cm^{-1}$, less than about $3 \times 10^2$ $cm^{-1}$, or less than about $1 \times 10^2$ $cm^{-1}$. The density of dislocations along the coalescence fronts may be greater than 5 $cm^{-1}$, greater than 10 $cm^{-1}$, greater than 20 $cm^{-1}$, greater than 50 $cm^{-1}$, greater than 100 $cm^{-1}$, greater than 200 $cm^{-1}$, or greater than 500 $cm^{-1}$.

The merged nitride crystal may be grown to a thickness greater than 5 microns, greater than 50 microns, greater than 0.5 millimeters, or greater than 5 millimeters. After cooling and removal from the reactor, the merged nitride crystal may be separated from the handle substrate. The inert coating, if present, may be removed from at least a portion of the edge of the handle substrate by scribing, abrasion, etching, or the like. The handle substrate may be dissolved or etched away, for example, by placing in contact with an acid, a base, or a molten flux, preferably in a way that produces negligible etching or other damage to the merged nitride crystal. For example, a glass, silicon, or germanium substrate may be etched away without damaging the merged nitride crystal by treatment in a solution comprising HF and/or $H_2SiF_6$. Alternatively, a glass or zinc oxide substrate may be etched away without damaging the merged nitride crystal by treatment in a solution comprising NaOH, KOH, or $NH_4OH$. A gallium arsenide or zinc oxide substrate may be etched away without damaging the merged nitride crystal by treatment in a solution comprising aqua regia or one or more of HCl, $HNO_3$, HF, $H_2SO_4$, and $H_3PO_4$. A sapphire or alumina substrate may be etched away without damaging the merged nitride crystal by treatment in molten $KBF_4$. After removal of the handle substrate, one or more surface of the merged nitride crystal may be lapped, polished, and/or chemical-mechanically polished. The merged nitride crystal may be sliced (sawed, polished, and/or chemical-mechanically polished) into one or more wafers.

Referring to FIGS. 7A-7D, the merged nitride crystal comprises two or more domains separated by one or more lines of dislocations. Depending on the geometry of the original nitride crystals, the pattern of domains may be, for example, (a) square (FIG. 7A), (b) rectangular (FIG. 7B), (c) hexagonal (FIG. 7C), (d) rhombal (FIG. 7D), or (e) irregular (not shown). Other patterns are also possible. The domains may have a first lateral dimension 380 and a second lateral dimension 390, the lateral dimensions defining a plane that is perpendicular to the thickness, where each of the first lateral dimension 380 and the second lateral dimension 390 may be at least about 0.5 millimeter, 1 millimeter, 2 millimeters, 4 millimeters, 5 millimeters, 10 millimeters, 15 millimeters, 20 millimeters, 25 millimeters, 35 millimeters, 50 millimeters, 75 millimeters, 100 millimeters, 150 millimeters, or at least about 200 millimeters. The polar misorientation angle γ between adjacent domains may be less than 0.5 degree, less than 0.2 degree, less than 0.1 degree, less than 0.05 degree, less than 0.02 degree, or less than 0.01 degree. The misorientation angles α and β between adjacent domains may be less than 1 degree, less than 0.5 degree, less than 0.2 degree, less than 0.1 degree, less than 0.05 degree, less than 0.02 degree, or less than 0.01 degree. Typically, γ will be less than or equal to α and β. The crystallographic misorientation angles α, 0, and γ may be greater than about 0.01 degree, greater than about 0.02 degree, greater than about 0.05 degree, or greater than about 0.1 degree. The density of dislocations along the lines between adjacent domains may be less than about $5 \times 10^5$ $cm^{-1}$, less than about $2 \times 10^5$ $cm^{-1}$, less than about $1 \times 10^5$ $cm^{-1}$, less than about $5 \times 10^4$ $cm^{-1}$, less than about $2 \times 10^4$ $cm^{-1}$, less than about $1 \times 10^4$ $cm^{-1}$, less than about $5 \times 10^3$ $cm^{-1}$, less than about $2 \times 10^3$ $cm^{-1}$, or less than about $1 \times 10^3$ $cm^{-1}$. The density of dislocations along the lines between adjacent domains may be greater than 50 $cm^{-1}$, greater than 100 $cm^{-1}$, greater than 200 $cm^{-1}$, greater than 500 $cm^{-1}$, greater than 1,000 $cm^{-1}$, greater than 2000 $cm^{-1}$, or greater than 5000 $cm^{-1}$.

Within individual domains, the merged nitride crystal may have a surface dislocation density less than about $10^7$ $cm^{-2}$, less than about $10^6$ $cm^{-2}$, less than about $10^5$ $cm^{-2}$, less than about $10^4$ $cm^{-2}$, less than about $10^3$ $cm^{-2}$, or less than about $10^2$ $cm^{-2}$. The domains may have a stacking-fault concentration below $10^3$ $cm^{-1}$, below $10^2$ $cm^{-1}$, below 10 $cm^{-1}$ or below 1 $cm^{-1}$. The merged nitride crystal may have a symmetric x-ray rocking curve full width at half maximum (FWHM) less than about 300 arc sec, less than about 200 arc sec, less than about 100 arc sec, less than about 50 arc sec, less than about 35 arc sec, less than about 25 arc sec, or less than about 15 arc sec. The merged nitride crystal may have a thickness between about 100 microns and about 100 millimeters, or between about 1 millimeter and about 10 millimeters. The merged nitride crystal may have a diameter of at least about 5 millimeters, at least about 10 millimeters, at least about 15 millimeters, at least about 20 millimeters, at least about 25 millimeters, at least about 35 millimeters, at least about 50 millimeters, at least about 75 millimeters, at least about 100 millimeters, at least about 150 millimeters, at least about 200 millimeters, or at least about 400 millimeters. The surface of the merged nitride crystal may have a crystallographic orientation within 10 degrees, within 5 degrees, within 2 degrees, within 1 degree, within 0.5 degree, within 0.2 degree, within 0.1 degree, within 0.05 degree, within 0.02 degree, or within 0.01 degree of (0 0 0 1) Ga-polar, (0 0 0 −1) N-polar, {1 0 −1 0} non-polar, or {1 1 −2 0} non-polar a-plane. The surface of the merged nitride crystal may have a (h k i l) semi-polar orientation, where i=−(h+k) and l and at least one of h and k are nonzero. In a specific embodiment, the crystallographic orientation of the merged nitride crystal is within 10 degrees, within 5 degrees, within 2 degrees, within 1 degree, within 0.5 degree, within 0.2 degree, within 0.1 degree, within 0.05 degree, within 0.02 degree, or within 0.01 degree of {11 −2 ±2}, {6 0 −6±1}, {5 0 −5±1}, {40 −4 ±1}, {3 0 −3 ±1}, {5 0 −5 ±2}, {7 0 −7 ±3}, {2 0 −2 ±1}, {3 0 −3 ±2}, {4 0 −4 ±3}, {5 0 −5 ±4}, {1 0 −1 ±1}, {1 0 −1 ±2}, {1 0 −1 ±3}, {2 1 −3 ±1}, or ({3 0 −3 ±4}. The merged nitride crystal has a minimum lateral dimension of at least four millimeters. In some embodiments, the merged nitride crystal has a minimum lateral dimension of at least one centimeter, at least two centimeters, at least three centimeters, at least four centimeters, at least five centimeters, at least six centimeters, at least eight centimeters, at least ten centimeters, or at least twenty centimeters.

In some embodiments, the merged nitride crystal is used as a substrate for epitaxy, forming a semiconductor structure. The merged nitride crystal may be sawed, lapped, polished, dry etched, and/or chemical-mechanically polished by methods that are known in the art. One or more edges of the merged nitride crystal may be ground. The merged nitride crystal, or a wafer formed therefrom, may be placed in a suitable reactor and an epitaxial layer grown by MOCVD, MBE, HVPE, or the like. In a particular embodiment, the epitaxial layer comprises GaN or $Al_xIn_yGa_{(1-x-y)}N$, where $0 \le x$, $y \le 1$. The morphology of the epitaxial layer is uniform from one domain to another over the surface because the surface orientation is almost identical.

In some embodiments, the merged nitride crystal is used as a substrate for further tiling. For example, referring to FIGS. 1A through 1K, the nitride crystal 101 may be chosen to be a merged nitride crystal. The tiling, coalescence, and re-tiling operation may be iterated more than twice, more than 4 times, more than 8 times, or more than 16 times. In this way, by successive tiling operations, a merged nitride crystal with excellent crystalline quality and very large diameter may be fabricated.

The merged nitride crystal, or a wafer that has been sliced and polished from the merged nitride crystal or from a boule obtained by bulk crystal growth using the merged nitride crystal as a seed, may be used as a substrate for fabrication into optoelectronic and electronic devices such as at least one of a light emitting diode, a laser diode, a photodetector, an avalanche photodiode, a transistor, a rectifier, a Schottky rectifier, a thyristor, a p-i-n diode, a metal-semiconductor-metal diode, high-electron mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascode switch, an inner sub-band emitter, a quantum well infrared photodetector, a quantum dot infrared photodetector, a solar cell, or a diode for photoelectrochemical water splitting and hydrogen generation device. In some embodiments, the positions of the devices with respect to the domain structure in the merged nitride crystal are chosen so that the active regions of individual devices lie within a single domain of the merged nitride crystal.

In other embodiments, the merged nitride crystal, or a wafer sliced and polished from the merged nitride crystal, is used as a seed crystal for bulk crystal growth. In one specific embodiment, the tiled crystal, or a wafer sliced and polished from the merged nitride crystal, is used as a seed crystal for ammonothermal crystal growth. In another embodiment, the tiled crystal, or a wafer sliced and polished from the merged nitride crystal, is used as a seed crystal for HVPE crystal growth.

In still other embodiments, the at least two nitride crystals or high quality epitaxial layers on the handle substrate, non-merged, are used as a substrate for fabrication into optoelectronic and electronic devices such as at least one of a light emitting diode, a laser diode, a photodetector, an avalanche photodiode, a transistor, a rectifier, a Schottky rectifier, a thyristor, a p-i-n diode, a metal-semiconductor-metal diode, high-electron mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascode switch, an inner sub-band emitter, a quantum well infrared photodetector, a quantum dot infrared photodetector, a solar cell, and a diode for photoelectrochemical water splitting and hydrogen generation device. The at least one device may flip-chip mounted onto a carrier and the handle substrate removed.

Figure 11:
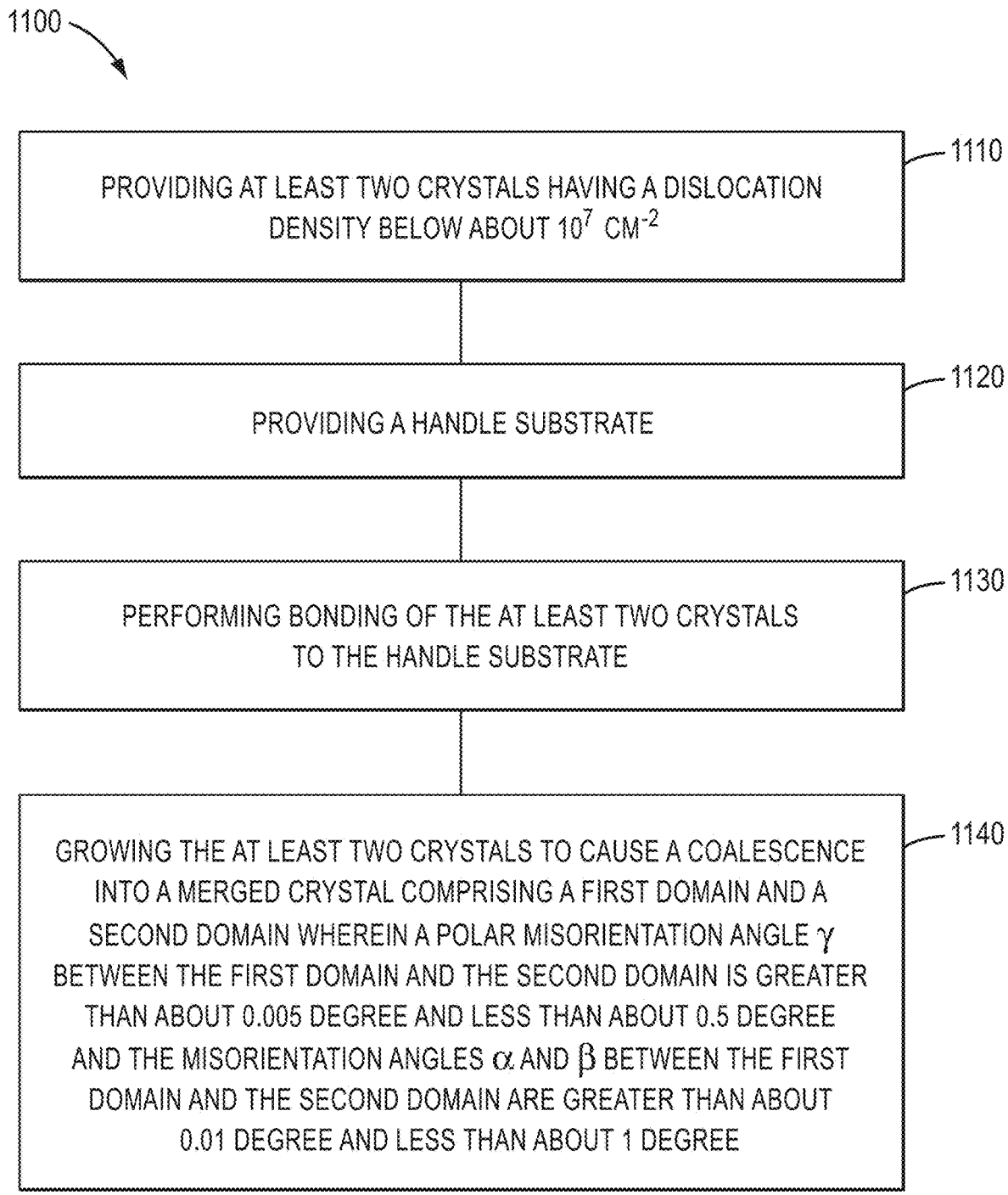
FIG. 11 is a flow chart of a method for making crystals according to some embodiments.

FIG. 11 is a flow chart depicting a method of making large area crystals. FIG. 11 shows a method 1100 for growth of a large-area crystal, the method comprising: providing at least two crystals having a dislocation density below about $10^7$ $cm^{-2}$ (see step 1110); providing a handle substrate (see step 1120); performing bonding of the at least two crystals to the handle substrate (see step 1130); and growing the at least two crystals to cause a coalescence into a merged crystal comprising a first domain and a second domain (see step 1140); wherein a polar misorientation angle γ between the first domain and the second domain is greater than about 0.005 degree and less than about 0.5 degree and the misorientation angles α and β between the first domain and the second domain are greater than about 0.01 degree and less than about 1 degree (also see step 1140).

Still further embodiments support method of making and method of use. Any of the embodiments below can be practiced in a variety of variations.

In certain embodiments of the method of FIG. 11, the at least two crystals have a hexagonal crystal structure.

In certain embodiments of the method of FIG. 11, the at least two crystals have a cubic crystal structure.

In certain embodiments of the method of FIG. 11, the at least two crystals having a cubic crystal structure are selected from BN, BP, BAs, AlP, AlAs, AlSb, β-SiC, GaP, GaAs, GaSb, InP, InAs, ZnS, ZnSe, CdS, CdSe, CdTe, CdZeTe, and HgCdTe.

In certain embodiments of the method of FIG. 11, the at least two crystals having a cubic crystal structure are selected from among ZnO, ZnS, AgI, CdS, CdSe, 2H—SiC, 4H—SiC, and 6H—SiC.

In certain embodiments of the method of FIG. 11, the at least two crystals comprise regions having a concentration of threading dislocations higher than about $10^6$ $cm^{-2}$ separated by at least one region characterized by a concentration of threading dislocations lower than about $10^6$ $cm^{-2}$.

In certain embodiments of the method of FIG. 11, the at least two nitride crystals having a hexagonal crystal structure comprise $Al_xIn_yGa_{(1-x-y)}N$, where $0 \le x$, y, $x+y \le 1$.

In certain embodiments of the method of FIG. 11, the at least two crystals are characterized by a threading dislocation density below about $10^6$ $cm^{-2}$.

In certain embodiments of the method of FIG. 11, the at least two crystals are characterized by a threading dislocation density below about $10^4$ $cm^{-2}$.

In certain embodiments of the method of FIG. 11, at least one of the two crystals has an ion-implanted/damaged region.

In certain embodiments of the method of FIG. 11, the surfaces of the at least two crystals being bonded to the handle substrate have a crystallographic orientation within about 10 degrees of (0 0 0 1), (0 0 0 -1), {1 0 -1 0}, {2 0

−2 ±1}, {1 1 −2 ±2}, {6 0 −6 ±1}, {5 0 −5 ±1}, {40 −4 ±1}, {3 0 −3 ±1}, {5 0 −5 2}, {7 0 −7 ±3}, {2 0 −2 ±1}, {3 0 −3 ±2}, {4 0 −4 ±3}, {5 0 −5±4}, {1 0 −1 ±1}, {1 0 −1 ±2}, {1 0 −1 ±3}, {2 1 −3 1}, or {3 0 −3 ±4}.

In certain embodiments of the method of FIG. 11, the large-area crystal has a region with a threading dislocation density below about $10^6$ cm$^{-2}$.

In certain embodiments of the method of FIG. 11, each of the first crystal, the second crystal, the first domain, and the second domain have a minimum lateral dimension of at least two millimeters.

In certain embodiments of the method of FIG. 11, the first crystal is derived from and detached from an ion-implanted crystal and the second crystal is derived from and detached from the same crystal.

In certain embodiments of the method of FIG. 11, the first crystal is derived from a first epitaxial layer on a third crystal and the second crystal is derived from a second epitaxial layer on the third crystal.

In certain embodiments of the method of FIG. 11, the bonding of the at least two crystals to the handle substrate is performed using a wafer-bonding tool.

In certain embodiments of the method of FIG. 11, the bonding of the at least two crystals to the handle substrate is performed using a pick-and-place tool.

In certain embodiments of the method of FIG. 11, the method further comprises applying a thermal treatment to increase the melting point of an adhesion layer provided between the at least two crystals and the handle substrate.

In certain embodiments of the method of FIG. 11, the method further comprises forming a semiconductor structure on the merged crystal, or a wafer that has been sliced and polished from the merged crystal or from a boule obtained by bulk crystal growth using the merged crystal as a seed.

In certain embodiments of forming a semiconductor on the merged crystal, the semiconductor structure is incorporated into an optoelectronic or electronic device, the optoelectronic or electronic device comprising at least one of wafer sliced and polished from the merged crystal or from a boule obtained by bulk crystal growth using the merged crystal as a seed.

In certain embodiments, the positions of the devices with respect to the domain structure in the merged crystal are chosen so that the active regions of individual devices lie within a single domain of the merged crystal.

EXAMPLES

Embodiments provided by the present disclosure are further illustrated by reference to the following examples. It will be apparent to those skilled in the art that many modifications, both to materials, and methods, may be practiced without departing from the scope of the disclosure.

Example 1

A template was prepared using four HVPE-grown bulk GaN crystals wafer-bonded to a handle substrate, also comprising HVPE-grown bulk GaN. The nitride crystals exhibited a crystallographic orientation within 1 degree of the (0 0 0 1)+c-plane (Ga face). The adjoining surfaces of the nitride crystals and the handle substrate were each coated with a 200 Ångstrom Ti layer followed by a 1.5 micron Au layer and wafer-bonded at a pressure of 5.4 MPa and a temperature of 450° C. under vacuum. The gaps between adjacent bonded nitride crystals were approximately 85 microns. The misorientation angles α, β, and γ between the adjacent bonded nitride crystals were all less than 0.1 degrees. The template was degreased, suspended by a silver wire, and placed in a silver capsule with a baffle. Approximately 37.3 g of polycrystalline GaN, 1.27 g of NH$_4$F mineralizer, and 30.4 g of ammonia were also placed in the capsule and the capsule was hermetically sealed. The capsule was placed in an internally-heated high pressure apparatus, heated to a temperature of approximately 675° C. for approximately 68 hours, then cooled, removed, and opened. The gap between the two nitride crystals was closed by newly-grown GaN, causing full coalescence of the crystals. The coalesced nitride crystal was removed from the handle substrate by dissolution of the Ti—Au adhesion layers by soaking in concentrated aqua regia solution. The linear etch pit densities at the coalescence fronts were measured as approximately $1.2 \times 10^3$ cm$^{-1}$, indicating high-quality boundaries.

Example 2

A template was prepared using two HVPE-grown bulk GaN crystals bonded to a handle substrate, also comprising HVPE-grown bulk GaN. The nitride crystals exhibited a crystallographic orientation within 1 degree of the (0 0 0 1)+c-plane (Ga face). The adjoining surfaces of the handle substrate and the nitride crystals were coated with a 200 Ångstrom Ti layer followed by a 1.0 micron Au layer. The nitride crystals further had an array of 300 micron diameter Si dots having a height of 0.6 microns, the dots being located at the vertices of a square grid having a period of 1,000 microns in both the x- and y-directions. The handle substrate was then placed on a heated stage at 475° C. and a pick and place tool was used to precisely position the two nitride crystals on the handle substrate. The adjoining surfaces of the nitride crystals and the handle substrate, while precisely aligned, were placed in contact for approximately 30 seconds and a bond was formed. The misorientation angles α and β between the adjacent bonded nitride crystals were less than 0.3 degrees and the misorientation angle γ between the adjacent bonded nitride crystals was less than 0.1 degree. The bonded template was subsequently heated to 275° C. in a nitrogen atmosphere and held for 24 hours. The template was degreased, suspended by a silver wire, and placed in a silver capsule with a baffle. Approximately 43.5 g of polycrystalline GaN, 1.28 g of NH$_4$F mineralizer, and 30.6 g of ammonia were also placed in the capsule and the capsule was hermetically sealed. The capsule was placed in an internally-heated high pressure apparatus, heated to a temperature of approximately 680° C. for approximately 20 hours, then cooled, removed, and opened. The gap between the two nitride crystals was closed by newly-grown GaN, causing full coalescence of the crystals. No pits were identified at the coalescence front by scanning electron microscopy (SEM), indicating a high-quality boundary.

Example 3

A template was prepared using three HVPE-grown bulk GaN crystals bonded to a handle substrate, also comprising HVPE-grown bulk GaN. The nitride crystals exhibited a crystallographic orientation that was miscut from the {1 0 −1 0} m-plane by approximately 0.25 degree toward [0 0 0 −1]. The adjoining surfaces of the handle substrate and the nitride crystals were coated with a 200 Ångstrom Ti layer followed by approximately a 20 micron thick Au layer and 3 micron thick AuSn layer on the handle substrate and the nitride crystals, respectively. The handle substrate was then placed on a heated stage at 330° C. and a pick and place tool was used to precisely position the three nitride crystals on the handle substrate. The adjoining surfaces of the nitride crystals and the handle substrate, while precisely aligned, were placed in contact for approximately 30 seconds and a bond was formed. The template was degreased and placed in a silver capsule with a baffle. Approximately 4,815 g of polycrystalline GaN, 172 g of NH$_4$F mineralizer, and 3,608 g of ammonia were also placed in the capsule and the capsule was hermetically sealed. The capsule was placed in an internally-heated high pressure apparatus, heated to a temperature of approximately 680° C. for approximately 100 hours, then cooled, removed, and opened. The gap between the three nitride crystals was closed by newly-grown GaN, causing full coalescence of the crystals. The three nitride crystals were subsequently removed from the handle substrate as one distinct piece. The misorientation angles α and β between the adjacent bonded nitride crystals were between about 0.02 degree and about 0.45 degrees and the misorientation angles γ between the adjacent bonded nitride crystals were about 0.09 degree and about 0.11 degree, respectively. The linear etch pit densities at the coalescence fronts were measured as approximately 6.08× $10^3$ cm$^{-1}$ and 5.84×$10^3$ cm$^{-1}$ for the two coalescence boundaries, indicating high-quality boundaries.

Example 4

A template was prepared using three HVPE-grown bulk GaN crystals bonded to a handle substrate comprising polycrystalline AlN. The nitride crystals exhibited a crystallographic orientation within about 0.5 degree of {1 0 –1 –1}. The adjoining surfaces of the handle substrate and the nitride crystals were coated with a 200 Ångstrom Ti layer followed by approximately a 20 micron thick Au layer and 3 micron thick AuSn layer on the handle substrate and the nitride crystals, respectively. The handle substrate was then placed on a heated stage at 330° C. and a pick and place tool was used to precisely position the three nitride crystals on the handle substrate. The adjoining surfaces of the nitride crystals and the handle substrate, while precisely aligned, were placed in contact for approximately 30 seconds and a bond was formed. The template was degreased and placed in a silver capsule with a baffle. Approximately 43.5 g of polycrystalline GaN, 2.56 g of NH$_4$F mineralizer, and 30 g of ammonia were also placed in the capsule and the capsule was hermetically sealed. The capsule was placed in an internally-heated high pressure apparatus, heated to a temperature of approximately 655° C. for approximately 51 hours, then cooled, removed, and opened. The gap between the three nitride crystals was closed by newly-grown GaN, causing full coalescence of the crystals. The misorientation angles α and β between the adjacent pairs of bonded nitride crystals were between about 0.03 degree and about 0.26 degree and the misorientation angles γ between the adjacent bonded nitride crystals were about 0.085 degree and less than 0.01 degree, respectively.

Example 5

A template was prepared using two HVPE-grown bulk GaN crystals bonded to a handle substrate comprising AlN. The nitride crystals exhibited a crystallographic orientation that was miscut from the {1 0 –1 0} m-plane by approximately 0.25 degree toward [0 0 0 –1]. The adjoining surfaces of the handle substrate and the nitride crystals were coated with a 3,000 Ångstrom Ti layer followed by approximately a 20 micron thick Au layer and 3 micron thick AuSn layer on the handle substrate and the nitride crystals, respectively. The handle substrate was then placed on a heated stage at 330° C. and a pick and place tool was used to precisely position the two nitride crystals on the handle substrate. The adjoining surfaces of the nitride crystals and the handle substrate, while precisely aligned, were placed in contact for approximately 30 seconds and a bond was formed. The template was degreased and placed in a silver capsule with a baffle. Approximately 37.54 g of polycrystalline GaN, 2.57 g of NH$_4$F mineralizer, and 30.08 g of ammonia were also placed in the capsule and the capsule was hermetically sealed. The capsule was placed in an internally-heated high pressure apparatus, heated to a temperature of approximately 663° C. for approximately 51 hours, then cooled, removed, and opened. The gap between the two nitride crystals was closed by newly-grown GaN, causing full coalescence of the crystals. The two nitride crystals were subsequently removed from the handle substrate as one distinct piece. The nitride crystals were then placed in a silver capsule with a baffle. Approximately 3,560 g of polycrystalline GaN, 174.1 g of NH$_4$F mineralizer, and 2,637.88 g of ammonia were also placed in the capsule and the capsule was hermetically sealed. The capsule was placed in an internally-heated high pressure apparatus, heated to a temperature of approximately 680° C. for approximately 116 hours, then cooled, removed, and opened. The misorientation angles α and β between the adjacent bonded nitride crystals were approximately 0.03 degree and the misorientation angle γ between the adjacent bonded nitride crystals was approximately 0.04 degree. The linear etch pit densities at the coalescence front was measured as approximately 6.75×$10^3$ cm$^{-1}$, indicating high-quality boundaries.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method for growth of a merged crystal, the method comprising:
   depositing a first adhesion layer on a surface of a handle substrate;
   providing at least a first crystal assembly comprising a first crystal, a first grown release layer and a first grown epitaxial layer and a second crystal assembly comprising a second crystal, a second grown release layer and a second grown epitaxial layer, wherein the first and second grown release layers are capable of being selectively electrochemically etched or photoelectrochemically etched preferentially with respect to the first crystal and the second crystal and the first grown epitaxial layer and the second grown epitaxial layer have a thickness between one micron and 50 microns;
   bonding the first grown epitaxial layer to the first adhesion layer;
   separating at least a portion of the first crystal from at least a portion of the first grown epitaxial layer, to form a first region of the first grown epitaxial layer that remains bonded to the handle substrate, by electrochemically or photoelectrochemically etching at least a portion of the first grown release layer;
   bonding the second grown epitaxial layer to the first adhesion layer proximate to the first region of the first grown epitaxial layer;

separating at least a portion of the second crystal from at least a portion of the second grown epitaxial layer to form a second region of the second grown epitaxial layer that remains bonded to the handle substrate to form a tiled substrate by electrochemically or photo-electrochemically etching at least a portion of the second grown release layer;

and laterally and vertically growing a crystalline composition over the tiled substrate to form a merged crystal.

2. The method of claim 1, wherein the second crystal assembly comprises at least a portion of the first crystal that is separated from the first region of the first grown epitaxial layer.

3. The method of claim 1, wherein the first grown epitaxial layer and the second grown epitaxial layer comprise GaN.

4. The method of claim 1, wherein an average dislocation density of each of the first grown epitaxial layer and the second grown epitaxial layer is below $10^7$ cm$^{-2}$.

5. The method of claim 1, wherein an average dislocation density of each of the first grown epitaxial layer and the second grown epitaxial layer is below $10^5$ cm$^{-2}$.

6. The method of claim 1, wherein the handle substrate is selected from sapphire, aluminum oxide, mullite, silicon, silicon nitride, germanium, silicon germanium, diamond, gallium arsenide, silicon carbide, MgAl$_2$O$_4$ spinel, zinc oxide, indium phosphide, gallium nitride, indium nitride, gallium aluminum indium nitride, and aluminum nitride.

7. The method of claim 1, wherein the first adhesion layer comprises at least two of Au, Ti, Cr or W.

8. The method of claim 1, wherein the handle substrate has a thermal expansion coefficient parallel to a surface on which the first adhesion layer is disposed that is between $5.5\times10^{-6}$ K$^{-1}$ and $6.5\times10^{-6}$ K$^{-1}$ at temperatures between room temperature and 700 degrees Celsius.

9. The method of claim 1, wherein the handle substrate has substantially the same composition as the first and second crystals.

10. The method of claim 1, wherein a first domain of the merged crystal, overlying the first region of the first grown epitaxial layer, has a first nominal crystallographic orientation ($x_1$ $y_1$ $z_1$), and a second domain of the merged crystal, overlying the second region of the second grown epitaxial layer, has a second nominal crystallographic orientation ($x_2$ $y_2$ $z_2$), the first nominal crystallographic orientation ($x_1$ $y_1$ $z_1$) and the second nominal crystallographic orientation ($x_2$ $y_2$ $z_2$) being identical; and wherein $z_1$ is a negative surface normal of the first nominal crystallographic orientation, and $x_1$ and $y_1$ are crystallographic vectors that are orthogonal to $z_1$;

$z_2$ is a negative surface normal of the second nominal crystallographic orientation, and $x_2$ and $y_2$ are crystallographic vectors that are orthogonal to $z_2$;

a polar misorientation angle $\gamma$ between $z_1$ and $z_2$ is less than 0.5 degrees;

a misorientation angle $\alpha$ between $x_1$ and $x_2$ is less than 1 degree; and a misorientation angle $\beta$ between $y_1$ and $y_2$ is less than 1 degree.

11. The method of claim 10, wherein the first domain and the second domain are separated by a line of dislocations with a linear density less than $5\times10^5$ cm$^{-1}$;

a polar misorientation angle $\gamma$ between the first domain and the second domain is less than 0.5 degree; and azimuthal misorientation angles $\alpha$ and $\beta$ are less than 1 degree.

12. The method of claim 1, wherein bonding of at least the first grown epitaxial layer and the second grown epitaxial layer to the first adhesion layer to form the tiled substrate is performed by a wafer bonding process.

13. The method of claim 1, wherein the first crystal assembly and the second crystal assembly are placed on the handle substrate by at least one of a pick and place machine, or robot, or a die attach tool.

14. The method of claim 1, wherein a region of the second crystal that is separated from the second region of the second grown epitaxial layer is attached to a block and the block is placed in a kinematic mount configured to align the first and second crystal assemblies and the handle substrate during the bonding processes.

15. The method of claim 1, further comprising performing a bulk crystal growth process on a surface of the merged crystal or on a surface prepared from the merged crystal to form a bulk crystal.

16. The method of claim 1, wherein the handle substrate comprises an oxide, nitride, or oxynitride of at least one of Al, Ga, or In.

17. The method of claim 1, wherein the first grown epitaxial layer is a patterned layer that comprises a plurality of channels that extend through the first grown epitaxial layer, and the channels are between 10 microns and 10 millimeters wide, and the second grown epitaxial layer is a patterned layer that comprises a plurality of channels that extend through the second grown epitaxial layer, and the channels are between 10 microns and 10 millimeters wide.

18. The method of claim 1, wherein a gap is formed between the first grown epitaxial layer and the second grown epitaxial layer, the gap is measured in a direction parallel to a surface of the first adhesion layer to which the first grown epitaxial layer and the second grown epitaxial layer are bonded, and the gap is less than 5 millimeters.

19. The method of claim 1, wherein the crystalline composition is grown over the tiled substrate to form a merged crystal by an ammonothermal process.

20. The method of claim 1, wherein the first grown release layer has a different composition than both a first portion of the first crystal and the first grown epitaxial layer, and the second grown release layer has a different composition than both a second portion of the second crystal and the second grown epitaxial layer.

21. The method of claim 1, wherein the first drown release layer is formed by growing a layer on a surface of the first crystal and the second grown release layer is formed by growing a layer on a surface of the second crystal.

22. The method of claim 1, wherein the first grown epitaxial layer and the second grown epitaxial layer comprise GaN and the first grown release layer and the second grown release layer comprise Al$_x$In$_y$Ga$_{1-x-y}$N, where 0≤x, y, x+y≤1, and wherein at least one of the first grown release layer and the second grown release layer can be selectively etched relative to the first and second crystals and the first and second grown epitaxial layers.

23. The method of claim 1, wherein the first grown epitaxial layer and the second grown epitaxial layer are formed by a deposition process comprising at least one of MOCVD, MBE, or HVPE.

24. The method of claim 1, further comprising placing an electrical contact on the first crystal, illuminating the first grown release layer with above-bandgap radiation, and performing a photoelectrochemical etching process on the first grown release layer.

25. The method of claim 1, further comprising placing a plurality of epitaxial layers on the handle substrate and forming a rhombal tiling pattern.

26. The method of claim 1, further comprising placing a plurality of epitaxial layers on the handle substrate and forming a hexagonal tiling pattern.

27. The method of claim 1, wherein
the first grown epitaxial layer is a patterned layer that comprises a plurality of channels that extend through the first grown epitaxial layer,
the second grown epitaxial layer is a patterned layer that comprises a plurality of channels that extend through the second grown epitaxial layer, and
the pattern comprises a series of stripes.

28. The method of claim 1, further comprising depositing a second adhesion layer on a surface of the first grown epitaxial layer opposite the first grown release layer before bonding the first grown epitaxial layer to the first adhesion layer.

29. The method of claim 28, wherein each of the first adhesion layer and the second adhesion layer comprise Au.

* * * * *

UNITED STATES PATENT AND TRADEMARK OFFICE
CERTIFICATE OF CORRECTION

| | |
|---|---|
| PATENT NO. | : 11,453,956 B2 |
| APPLICATION NO. | : 16/550947 |
| DATED | : September 27, 2022 |
| INVENTOR(S) | : Mark P. D'Evelyn et al. |

It is certified that error appears in the above-identified patent and that said Letters Patent is hereby corrected as shown below:

In the Claims

In Column 28, Line 50, in Claim 21, delete "drown" and insert -- grown --.

Signed and Sealed this
Fourth Day of July, 2023

Katherine Kelly Vidal
*Director of the United States Patent and Trademark Office*